(12) United States Patent
Kim et al.

(10) Patent No.: US 9,324,609 B2
(45) Date of Patent: Apr. 26, 2016

(54) METHODS OF MANUFACTURING SEMICONDUCTOR DEVICES HAVING HIGH ASPECT RATIO

(71) Applicant: Samsung Electronics Co., Ltd., Suwon-si, Gyeonggi-do (KR)

(72) Inventors: Chan-Won Kim, Seoul (KR); Jung-Woo Seo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/673,169

(22) Filed: Mar. 30, 2015

(65) Prior Publication Data
US 2015/0364366 A1    Dec. 17, 2015

(30) Foreign Application Priority Data

Jun. 11, 2014    (KR) .................. 10-2014-0071039

(51) Int. Cl.
| H01L 21/00 | (2006.01) |
| H01L 21/768 | (2006.01) |
| H01L 21/56 | (2006.01) |
| H01L 21/02 | (2006.01) |
| H01L 21/033 | (2006.01) |
| H01L 49/02 | (2006.01) |
| H01L 21/311 | (2006.01) |

(52) U.S. Cl.
CPC .... *H01L 21/76877* (2013.01); *H01L 21/02164* (2013.01); *H01L 21/0332* (2013.01); *H01L 21/31144* (2013.01); *H01L 21/565* (2013.01); *H01L 21/76802* (2013.01); *H01L 28/40* (2013.01)

(58) Field of Classification Search
CPC .............. H01L 21/0332; H01L 21/565; H01L 21/76802; H01L 21/76877; H01L 28/40
See application file for complete search history.

(56) References Cited

U.S. PATENT DOCUMENTS

| 5,386,382 A * | 1/1995 | Ahn ..................... H01L 21/768 257/296 |
| 6,329,683 B2 * | 12/2001 | Kohyama ............. H01L 21/768 257/306 |
| 6,475,921 B2 | 11/2002 | Sandhu |
| 7,074,718 B2 * | 7/2006 | Kim .................. H01L 21/76804 257/E21.507 |
| 7,273,780 B2 | 9/2007 | Kim |

(Continued)

FOREIGN PATENT DOCUMENTS

| JP | 2013-004820 | 1/2013 |
| KR | 1020050123335 | 12/2005 |
| KR | 1020110131580 | 12/2011 |

*Primary Examiner* — Richard Booth
(74) *Attorney, Agent, or Firm* — Myers Bigel & Sibley, P.A.

(57) ABSTRACT

Methods of forming a hard mask capable of implementing an electrode having a high aspect ratio are provided. A molding layer may be formed on a substrate. A sacrificial layer may be formed on the molding layer. First mask patterns may be formed in parallel in the sacrificial layer. After the first mask patterns are formed, second mask patterns, which cross the first mask patterns and are in parallel, may be formed in the sacrificial layer. The first mask patterns and the second mask patterns may have materials more opaque than the sacrificial layer. Upper surfaces of the sacrificial layer, the first mask patterns and the second mask patterns may be exposed at the same horizontal level. The sacrificial layer may be removed. Openings, which pass through the molding layer, may be formed using the first mask patterns and the second mask patterns as etch masks. Electrodes may be formed in the openings.

20 Claims, 34 Drawing Sheets

(56) References Cited

U.S. PATENT DOCUMENTS

| | | |
|---|---|---|
| 8,012,881 B1 | 9/2011 | Lee et al. |
| 8,582,276 B2 | 11/2013 | Chen |
| 2014/0106119 A1 | 4/2014 | Ueba |

* cited by examiner

METHODS OF MANUFACTURING SEMICONDUCTOR DEVICES HAVING HIGH ASPECT RATIO

CROSS-REFERENCE TO RELATED APPLICATION

This U.S. non-provisional application claims priority under 35 U.S.C. §119 to Korean Patent Application No. 10-2014-0071039, filed on Jun. 11, 2014, the disclosure of which is hereby incorporated by reference in its entirety.

BACKGROUND

Example embodiments of the inventive concepts relate to methods of forming a hard mask capable of implementing an electrode having a high aspect ratio.

In order to increase a capacitance of a capacitor within a limited area, various studies are being conducted to implement a lower electrode having a high aspect ratio.

The increase in an aspect ratio of a lower electrode may cause a variety of problems due to a limit of a patterning process. For example, in order to form a hole having an aspect ratio for the lower electrode, a thick or opaque hard mask layer may be used in the patterning process. However, determining an alignment/overlay with a lower layer in the patterning process may not be easy due to the thick or opaque hard mask layer. Further, in order to form the hole in the case of using the thick hard mask layer, a significant difficulty may be overcome in photolithography and etching processes.

SUMMARY

Embodiments of the inventive concepts provide methods of forming a semiconductor device which includes a pattern having a high aspect ratio.

According to some embodiments, a method of forming a semiconductor device includes forming a molding layer on a substrate. A sacrificial layer is formed on the molding layer. A plurality of first mask patterns are formed in parallel in the sacrificial layer. After forming the first mask patterns, a plurality of second mask patterns, which cross the first mask patterns and are in parallel, are formed in the sacrificial layer. The first mask patterns and the second mask patterns have materials more opaque than the sacrificial layer. Upper surfaces of the sacrificial layer, the first mask patterns, and the second mask patterns are exposed at the same horizontal level. The sacrificial layer is removed. A plurality of openings, which pass through the molding layer, are formed by using the first mask patterns and the second mask patterns as etch masks. Electrodes are formed in the openings.

In some embodiments, each of the first mask patterns and the second mask patterns may include a sloped side surface. The side surfaces of the second mask patterns may have slopes different from the side surfaces of the first mask patterns.

In some embodiments, the side surfaces of the first mask patterns and the second mask patterns may include inverted slopes.

In some embodiments, the sacrificial layer may include silicon oxide. Each of the first mask patterns and the second mask patterns may include polysilicon, a metal, a metal nitride, or a combination thereof.

In some embodiments, the second mask patterns may include materials different from the first mask patterns.

In some embodiments, after forming the first mask patterns, the forming of the second mask patterns may include forming first trenches in parallel by patterning the sacrificial layer, forming the first mask patterns in the first trenches, forming second trenches in parallel by patterning the sacrificial layer and the first mask patterns, and forming the second mask patterns in the second trenches. The second trenches may completely pass through the first mask patterns.

In some embodiments, after forming the first mask patterns, the forming of the second mask patterns may include forming first trenches in parallel by patterning the sacrificial layer, forming the first mask patterns in the first trenches, forming second trenches in parallel by patterning the sacrificial layer, and forming the second mask patterns in the second trenches. The second trenches may be formed between the first mask patterns.

In some embodiments, after forming the first mask patterns, the forming of the second mask patterns may include forming first trenches in parallel by patterning the sacrificial layer, forming the first mask patterns in the first trenches, forming second trenches in parallel by patterning the sacrificial layer and the first mask patterns, and forming the second mask patterns in the second trenches. The first mask patterns may remain at respective bottoms of the second trenches.

In some embodiments, a height of each of the first mask patterns and the second mask patterns is greater than a width thereof.

In some embodiments, each of the openings may have an aspect ratio of 10:1 or more.

According to some embodiments, a method of forming a semiconductor device includes forming a molding layer on a substrate. A sacrificial layer is formed on the molding layer. A plurality of first mask patterns is formed in parallel in the sacrificial layer. After forming the first mask patterns, a plurality of second mask patterns, which cross the first mask patterns and are in parallel, are formed in the sacrificial layer. The first mask patterns and the second mask patterns have materials more opaque than the sacrificial layer. Upper surfaces of the sacrificial layer, the first mask patterns, and the second mask patterns are exposed at the same horizontal level. The sacrificial layer is removed. A plurality of openings, which pass through the molding layer, is formed by using the first mask patterns and the second mask patterns as etch masks. First electrodes are formed in the openings. The molding layer is removed. A capacitor dielectric layer is formed on the first electrodes. A second electrode is formed on the capacitor dielectric layer.

In some embodiments, the forming of the molding layer may include forming a first molding layer on the substrate, and forming a second molding layer, which is thinner than the first molding layer, on the first molding layer In some embodiments, the second molding layer may include a material having an etch rate lower than the first molding layer.

In some embodiments, a support layer may be formed between the first electrodes. The support layer may contact side surfaces of the first electrodes.

In some embodiments, the support layer may include a first support layer formed between the first molding layer and the second molding layer, and a second support layer formed on the second molding layer. The first support layer and the second support layer may include materials each having an etch selectivity with respect to the first molding layer and the second molding layer.

According to some embodiments, a method of forming a semiconductor device includes forming a molding layer on a substrate. A sacrificial layer is formed on the molding layer. A plurality of first mask patterns are formed in parallel in the sacrificial layer. After forming the first mask patterns, a plurality of second mask patterns, which cross the first mask patterns and are in parallel, are formed in the sacrificial layer. The first mask patterns and the second mask patterns have materials more opaque than the sacrificial layer. Upper surfaces of the sacrificial layer, the first mask patterns, and the second mask patterns are exposed at the same horizontal level. The sacrificial layer is removed. A plurality of openings, which pass through the molding layer, are formed using the first mask patterns and the second mask patterns as etch masks. First electrodes are formed in the openings. A capacitor dielectric layer is formed on the first electrodes. A second electrode is formed on the capacitor dielectric layer.

In some embodiments, upper ends of the first electrodes may be formed at a level lower than upper ends of the molding layer.

In some embodiments, the first electrodes may contact sidewalls and bottoms of the openings.

In some embodiments, the capacitor dielectric layer may contact sidewalls of the openings and an upper surface of the molding layer.

In some embodiments, the second electrode may fill the openings and cover the molding layer.

Detailed items of the other embodiments of the inventive concepts are included in the detailed descriptions and the accompanying drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
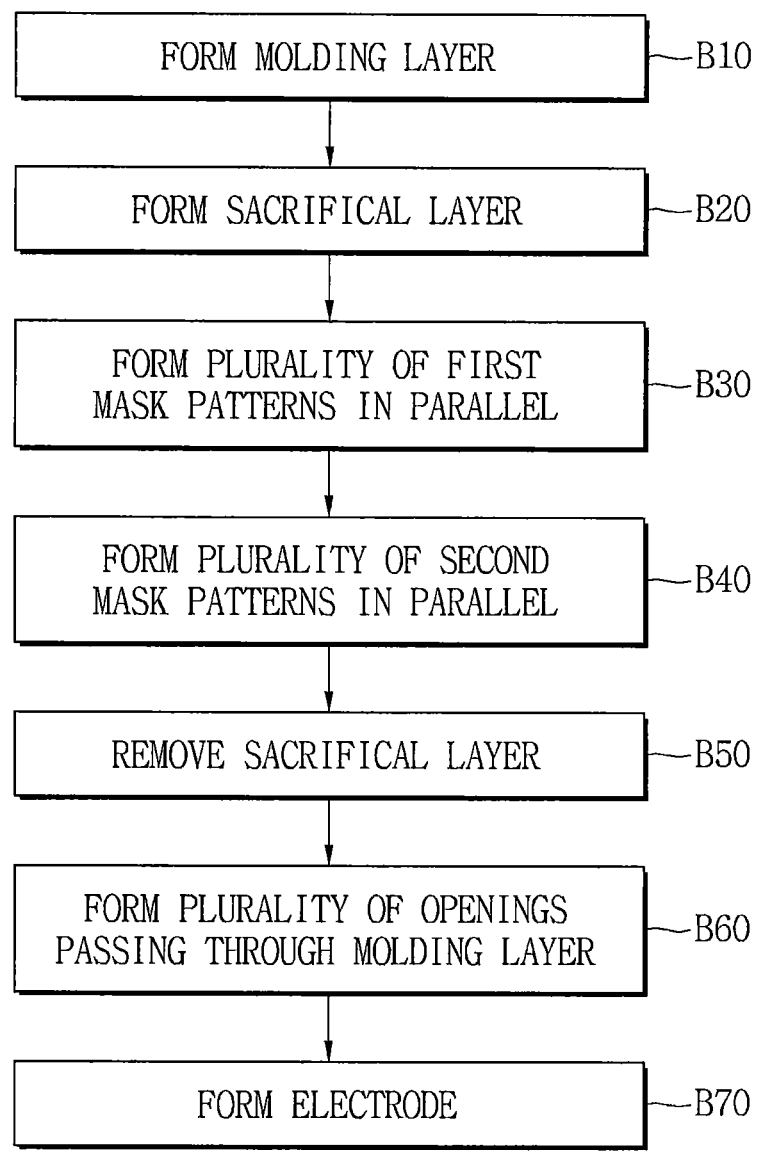
FIG. 1 is a flowchart for describing a method of forming a semiconductor device in accordance with example embodiments of the inventive concepts.

The inventive concepts will now be described more fully hereinafter with reference to the accompanying drawings, in which embodiments of the inventive concepts are shown. This inventive concepts may, however, be embodied in different forms and should not be construed as limited to the embodiments set forth herein. Rather, these example embodiments are provided so that this disclosure is thorough and complete and fully conveys the scope of the inventive concepts to one skilled in the art.

The terminology used herein is for the purpose of describing particular example embodiments only and is not intended to be limiting of the inventive concept. As used herein, the singular forms "a", "an," and "the" are intended to include the plural forms as well, unless the context clearly indicates otherwise. It will be further understood that the terms "comprises", "comprising,", "includes," and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected, or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the present specification, relative terms, such as "front side" and "back side", may be used herein for ease of description to describe the inventive concept. Accordingly, a front side or back side does not necessarily indicate a specific direction, location, or component but may be used interchangeably. For example, a front side could be interpreted as a back side, and a back side could be interpreted as a front side. Accordingly, a front side could be termed a first side, and a back side could be termed a second side. Conversely, a back side could be termed a first side, and a front side could be termed a second side. However, to avoid confusion, the terms "front side" and "back side" are not used in the same sense in one embodiment.

In the present specification, a term "near" indicates that any one of at least two components having symmetrical concepts is disposed nearer to another specific component than the others thereof. For instance, when a first end is near a first side, it may be inferred that the first end is nearer the first side than a second end or that the first end is nearer the first side than a second side. As used herein, the term "and/or" includes any and all combinations of one or more of the associated listed items.

FIG. 1 is a flowchart for describing a method of forming a semiconductor device in accordance with example embodiments of the inventive concepts.

Referring to FIG. 1, the method of forming the semiconductor device in accordance with example embodiments of the inventive concepts may include forming a molding layer on a substrate (B10), forming a sacrificial layer on the molding layer (B20), forming a plurality of first mask patterns in parallel in the sacrificial layer (B30), forming a plurality of second mask patterns, which cross the first mask patterns and are in parallel, in the sacrificial layer (B40), removing the sacrificial layer (B50), forming a plurality of openings, which pass through the molding layer, using the first mask patterns and the second mask patterns as etch masks (B60), and forming electrodes in the openings (B70).

The sacrificial layer may include a material more transparent than the first mask patterns and the second mask patterns. The first mask patterns and the second mask patterns may include materials more opaque than the sacrificial layer. Hereinafter, more detailed descriptions will be described with reference to drawings of process operations.

FIG. 2 to FIG. 29 are cross-sectional views and perspective views for describing a method of forming a semiconductor device in accordance with example embodiments of the inventive concepts.

Figure 2:
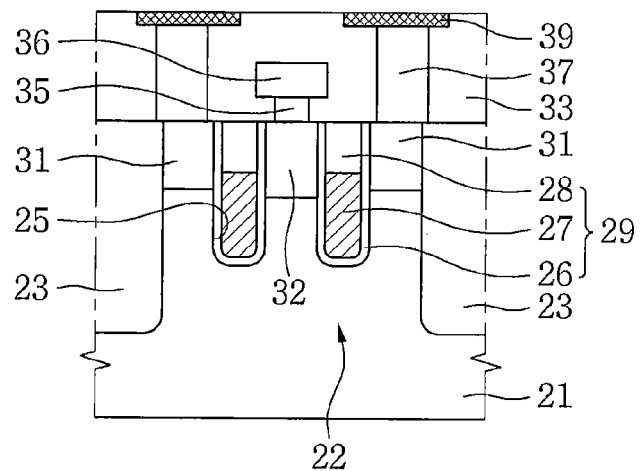
FIGS. 2 to 29 are cross-sectional views and perspective views for describing a method of forming a semiconductor device in accordance with example embodiments of the inventive concepts.

Referring to FIGS. 1 and 2, device isolation layers 23, which define an active region 22, may be formed in a substrate 21. Gate trenches 25, which cross the active region 22, may be formed. Gate structures 29 may be formed in the gate trenches 25. Each of the gate structures 29 may include a gate dielectric layer 26, a gate electrode 27, and a gate capping pattern 28. First and second source/drain regions 31 and 32 may be formed in the active region 22 adjacent to the gate structures 29.

An interlayer insulating layer 33 may be formed on the gate structures 29 and the first and second source/drain regions 31 and 32. A bit line plug 35, which contacts the second source/drain region 32, and a bit line 36 may be formed in the interlayer insulating layer 33. Buried contact plugs 37, which pass through the interlayer insulating layer 33, may be formed to contact the first source/drain regions 31. Landing pads 39 may be formed on the buried contact plugs 37.

A transistor may be constituted by the first and second source/drain regions 31 and 32, the active region 22, the gate dielectric layer 26, and the gate electrode 27. The plurality of transistors may be repeatedly configured on the substrate 21 in row and column directions. The transistor may perform a function of a switching device. In some example embodiments, the switching device may include a planar transistor, a sphere-shaped recess channel array transistor (SRCAT), a 3D transistor, a nano-wire transistor, a vertical transistor or a combination thereof.

The substrate 21 may include a semiconductor substrate, such as, for example, a silicon wafer. The device isolation layers 23 may be formed by using a shallow trench isolation (STI) technique. The device isolation layer 23 may include silicon oxide, silicon nitride, silicon oxynitride or a combination thereof. Each of the gate trenches 25 may cross the active region 22 and may extend between the device isolation layers 23. An upper end of the gate electrode 27 may be formed at a level lower than upper ends of the first and second source/drain regions 31 and 32. The gate capping pattern 28 may be formed on the gate electrode 27. The gate dielectric layer 26 may be formed between the gate electrode 27 and the active region 22. The second source/drain region 32 may be formed between the gate structures 29. The first source/drain regions 31 may be formed between the gate structures 29 and the device isolation layers 23.

The gate dielectric layer 26 may include silicon oxide, silicon nitride, silicon oxynitride, a high-K dielectric layer, or a combination thereof. The gate electrode 27 may include a conductive layer such as, for example, a metal, a metal nitride, a metal silicide, a semiconductor, a polysilicon or a combination thereof. The gate capping pattern 28 may include silicon oxide, silicon nitride, silicon oxynitride, a low-K dielectric layer or a combination thereof.

The interlayer insulating layer 33 may include silicon oxide, silicon nitride, silicon oxynitride, a low-K dielectric layer or a combination thereof. The interlayer insulating layer 33 may cover an upper surface of the substrate 21. In some embodiments, the interlayer insulating layer 33 may cover an entire upper surface of the substrate 21. The bit line plug 35 may contact the second source/drain region 32 and the bit line 36. The bit line plug 35 may include a conductive layer such as, for example, a metal, a metal nitride, a metal silicide, a semiconductor or a combination thereof. The bit line 36 may include a conductive layer such as, for example, a metal, a metal nitride, a metal silicide, a semiconductor or a combination thereof.

The buried contact plugs 37 may contact the first source/drain regions 31, respectively. Each of the buried contact plugs 37 may include a conductive layer such as, for example, a metal, a metal nitride, a metal silicide, a semiconductor, a polysilicon or a combination thereof. For example, each of the buried contact plugs 37 may include W, Ru, Ti, TiN or a combination thereof. Each of the landing pads 39 may contact one of the buried contact plugs 37. The landing pad 39 may have a width greater than a width of the buried contact plug 37. A vertical center of the landing pad 39 may be offset with respect to a vertical center of the buried contact plug 37. Each of the landing pads 39 may include a conductive layer such as, for example, a metal, a metal nitride, a metal silicide, a semiconductor, or a combination thereof.

FIGS. 4 to 12 are perspective views which may describe a partial configuration of a method of forming a semiconductor device in accordance with example embodiments of the inventive concepts.

Figure 3:
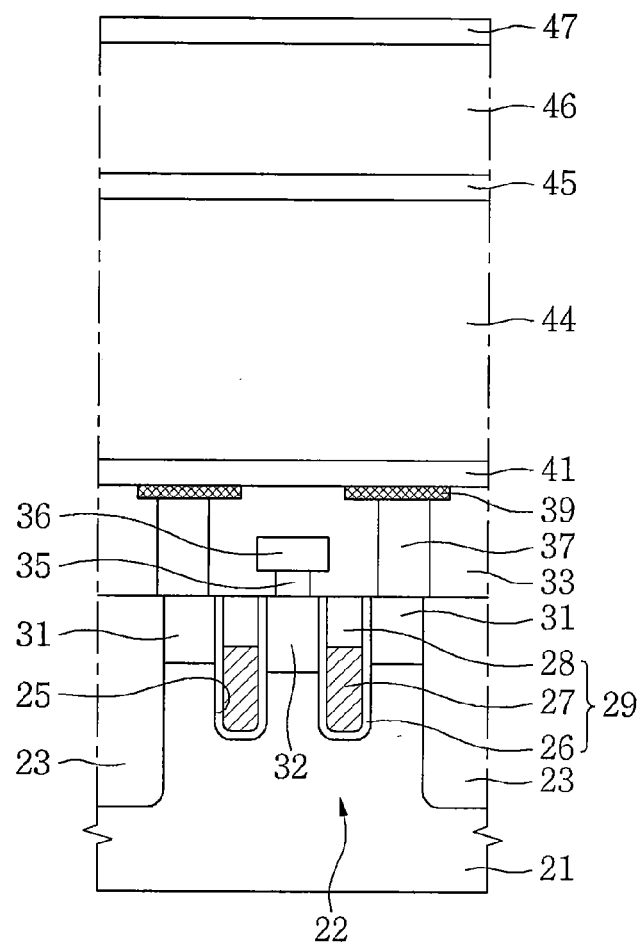
Figure 4:
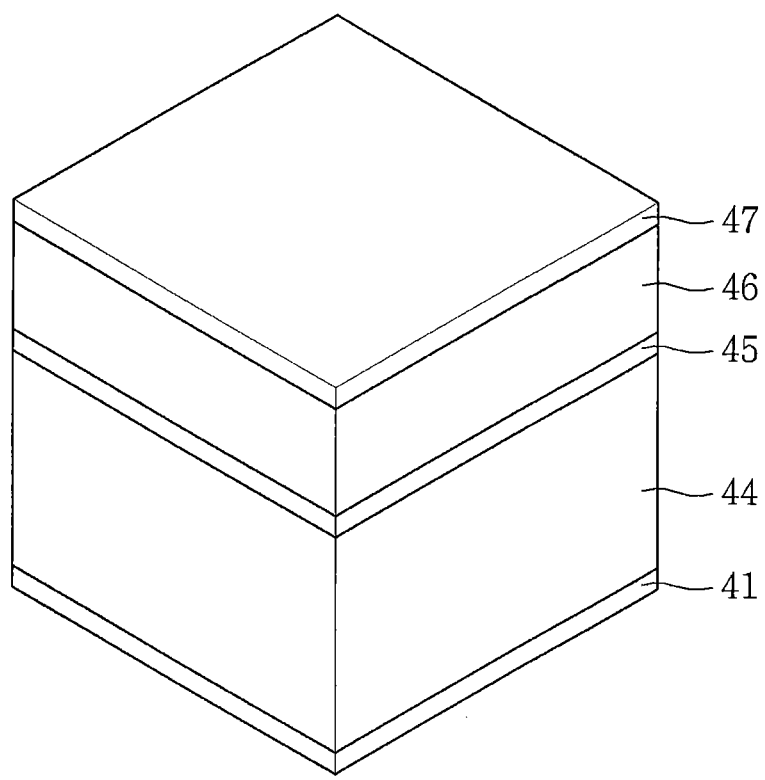

Referring to FIGS. 1, 3 and 4, molding layers 44 and 46 may be formed on the substrate 21 (B10). The molding layers 44 and 46 may include a first molding layer 44 and a second molding layer 46.

For example, an etch-stop layer 41 may be formed on the interlayer insulating layer 33 and the landing pads 39. The first molding layer 44 may be formed on the etch-stop layer 41. A first support layer 45 may be formed on the first molding layer 44. The second molding layer 46 may be formed on the first support layer 45. A second support layer 47 may be formed on the second molding layer 46.

The etch-stop layer 41 may cover the interlayer insulating layer 33 and the landing pads 39. The etch-stop layer 41 may include silicon oxide, silicon nitride, silicon oxynitride, metal oxide or a combination thereof. The first molding layer 44 may be thicker than the etch-stop layer 41. An upper end of the first molding layer 44 may be planarized. A chemical mechanical polishing (CMP) process, an etch-back process, or a combination thereof may be used to planarize the first molding layer 44. The first molding layer 44 may include silicon oxide, silicon nitride, silicon oxynitride, a low-K dielectric layer or a combination thereof. The etch-stop layer 41 may include a material having an etch selectivity with respect to the first molding layer 44. For example, the etch-stop layer 41 may include silicon nitride, and the first molding layer 44 may include silicon oxide.

The first support layer 45 may be thinner than the first molding layer 44. The first support layer 45 may include a material having an etch selectivity with respect to the first molding layer 44 and the second molding layer 46. The first support layer 45 may include silicon oxide, silicon nitride, silicon oxynitride, metal oxide or a combination thereof.

The second molding layer 46 may be thicker than the first support layer 45 and may be thinner than the first molding layer 44. An upper end of the second molding layer 46 may be planarized. A CMP process, an etch-back process or a combination thereof may be used to planarize the second molding layer 46. The second molding layer 46 may include silicon oxide, silicon nitride, silicon oxynitride, a low-K dielectric layer or a combination thereof. The second molding layer 46 may include a material having an etch rate lower than the first molding layer 44. For example, the first molding layer 44 may include tetra ethyl ortho silicate (TEOS), and the second molding layer 46 may include high density plasma (HDP) oxide.

The second support layer 47 may be thinner than the second molding layer 46. The second support layer 47 may include a material having an etch selectivity with respect to both the first molding layer 44 and the second molding layer 46. The second support layer 47 may include silicon oxide, silicon nitride, silicon oxynitride, metal oxide or a combination thereof.

Figure 5:
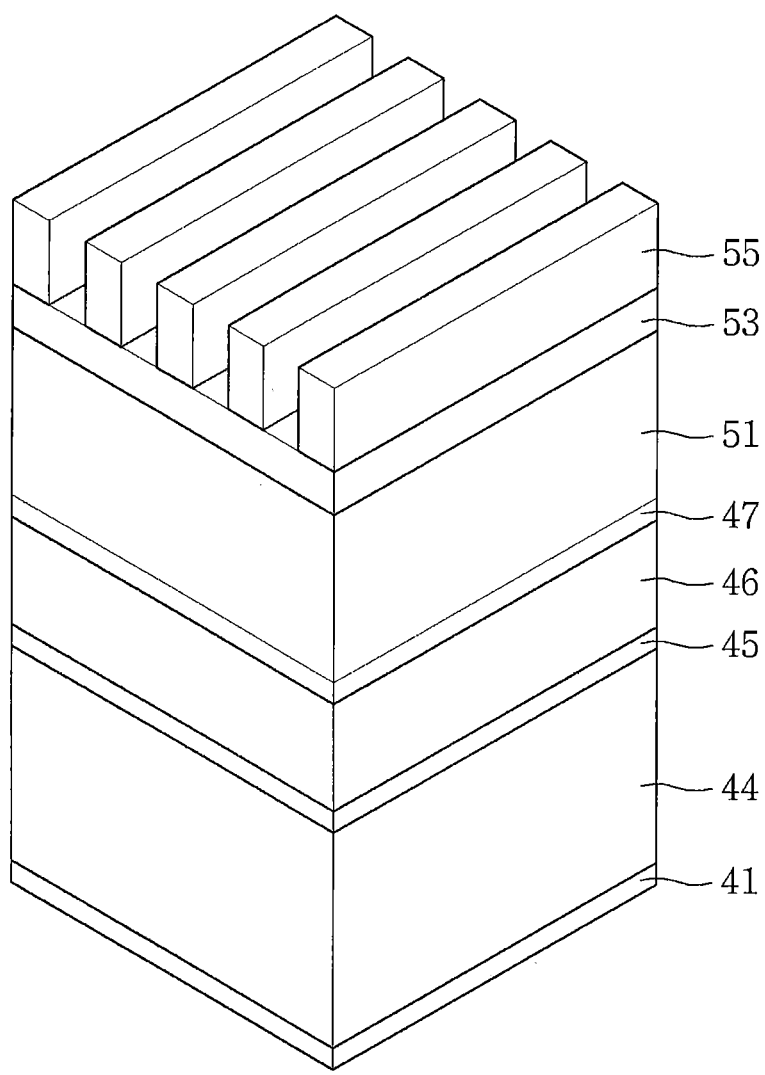

Referring to FIGS. 1 and 5, a sacrificial layer 51 may be formed on the molding layers 44 and 46 (B20).

For example, the sacrificial layer 51 may be formed on the second support layer 47. An upper mask layer 53 may be formed on the sacrificial layer 51. A photomask pattern 55 may be formed on the upper mask layer 53. The sacrificial layer 51 may be thicker than the second support layer 47.

The sacrificial layer 51 may include a transparent material. The sacrificial layer 51 may include a material having an etch selectivity with respect to the second support layer 47. For example, the sacrificial layer 51 may include silicon oxide. The upper mask layer 53 may be thinner than the sacrificial layer 51. The upper mask layer 53 may include a material having an etch selectivity with respect to the sacrificial layer 51. The photomask pattern 55 may be formed by using a photolithography process.

According to example embodiments of the inventive concepts, since the sacrificial layer 51 includes the transparent material, it may be very useful to determine alignment and overlay for the photomask pattern 55.

Figure 6:
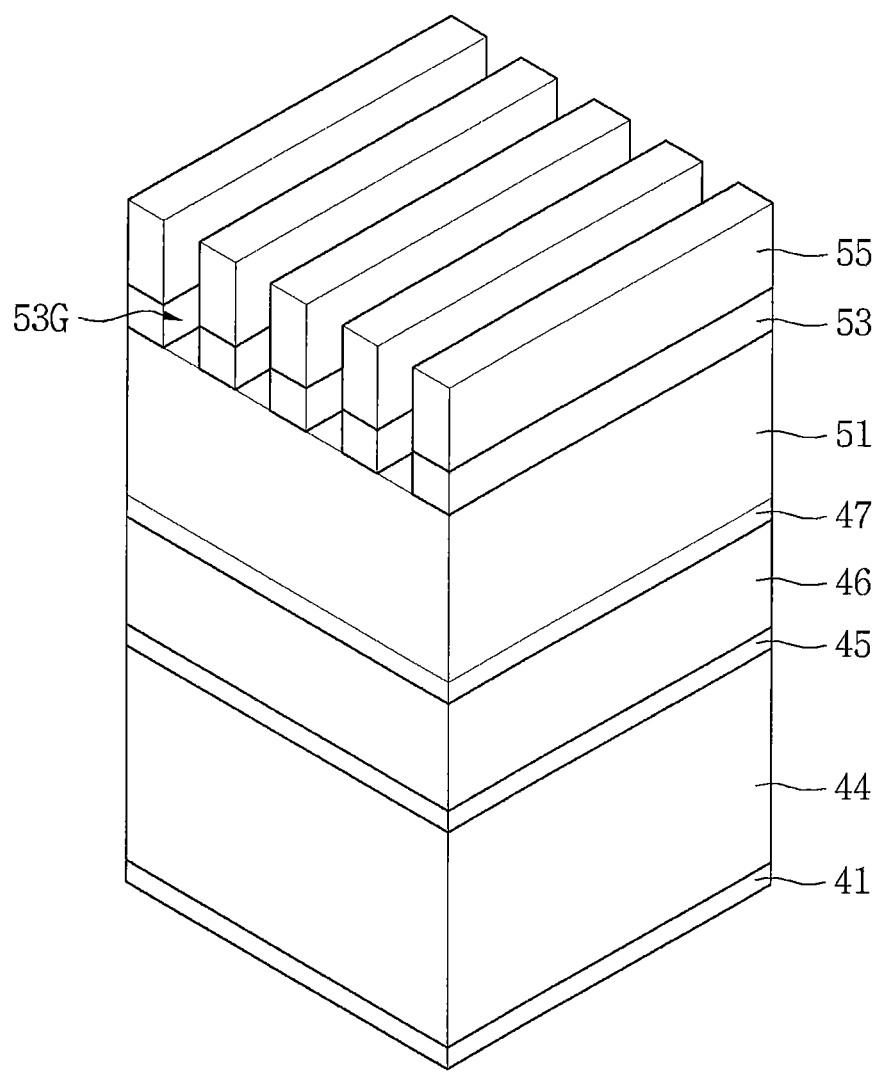

Referring to FIGS. 1 and 6, upper trenches 53G may be formed in the upper mask layer 53 using the photomask pattern 55 as an etch mask. The upper trenches 53G may be in parallel. The upper trenches 53G may have the same width.

According to example embodiments of the inventive concepts, since the sacrificial layer 51 includes a transparent material, it may be very useful to determine alignment and overlay for the upper trenches 53G.

Figure 7:
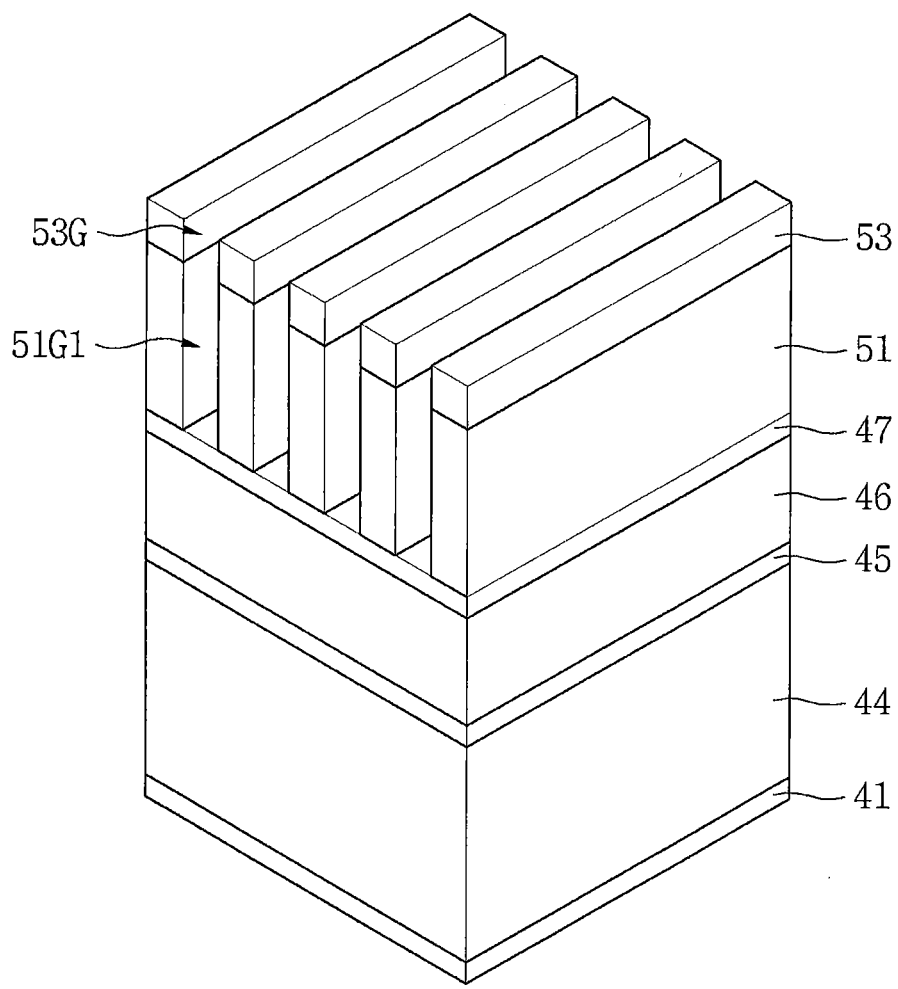

Referring to FIGS. 1 and 7, a plurality of first trenches 51G1, which pass through the sacrificial layer 51, may be formed using the upper mask layer 53 as an etch mask. The first trenches 51G1 may be in parallel. The first trenches 51G1 may have the same width. A height of each of the first trenches 51G1 may be greater than a width thereof. Each of the first trenches 51G1 may have a bar or groove shape. The first trenches 51G1 may completely pass through the sacrificial layer 51. The second support layer 47 may be exposed at bottoms of the first trenches 51G1. An anisotropic etching process may be applied to form the first trenches 51G1.

In some example embodiments, each of the first trenches 51G1 may have an inverted trapezoidal shape in which a lower width thereof is smaller than an upper width thereof.

According to example embodiments of the inventive concepts, since the sacrificial layer 51 includes a transparent material, it may be very useful to determine alignment and overlay for the first trenches 51G1.

Figure 8:
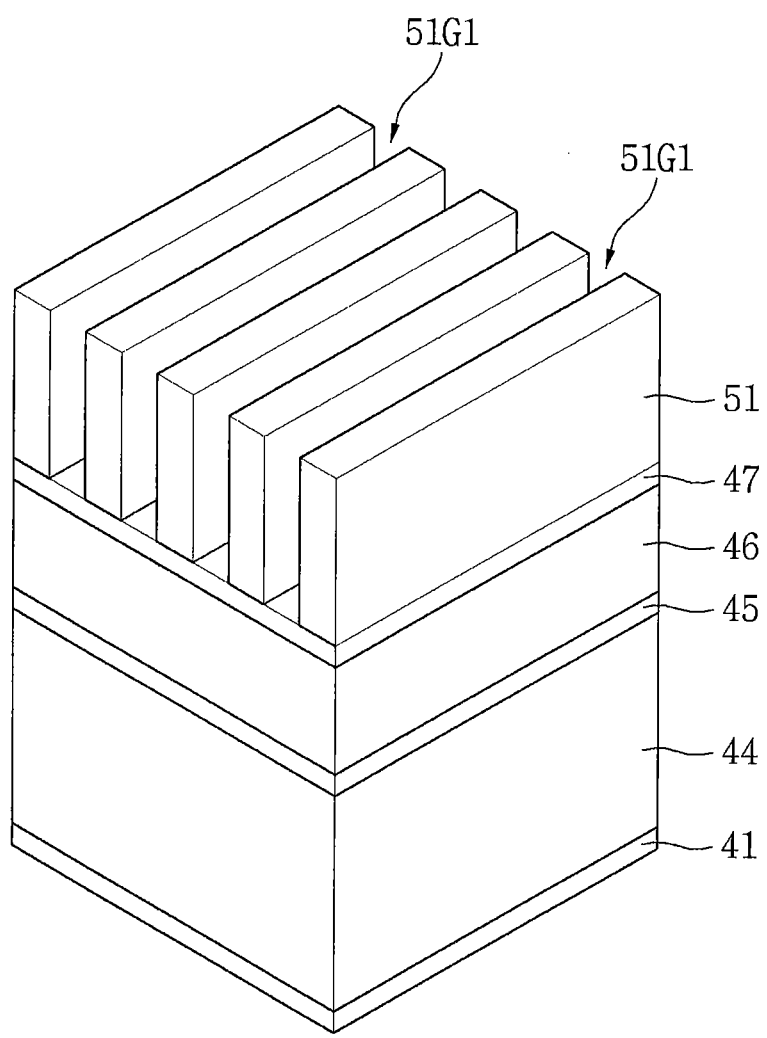

Referring to FIGS. 1 and 8, upper ends of the sacrificial layer 51 may be exposed by removing the upper mask layer 53.

Figure 9:
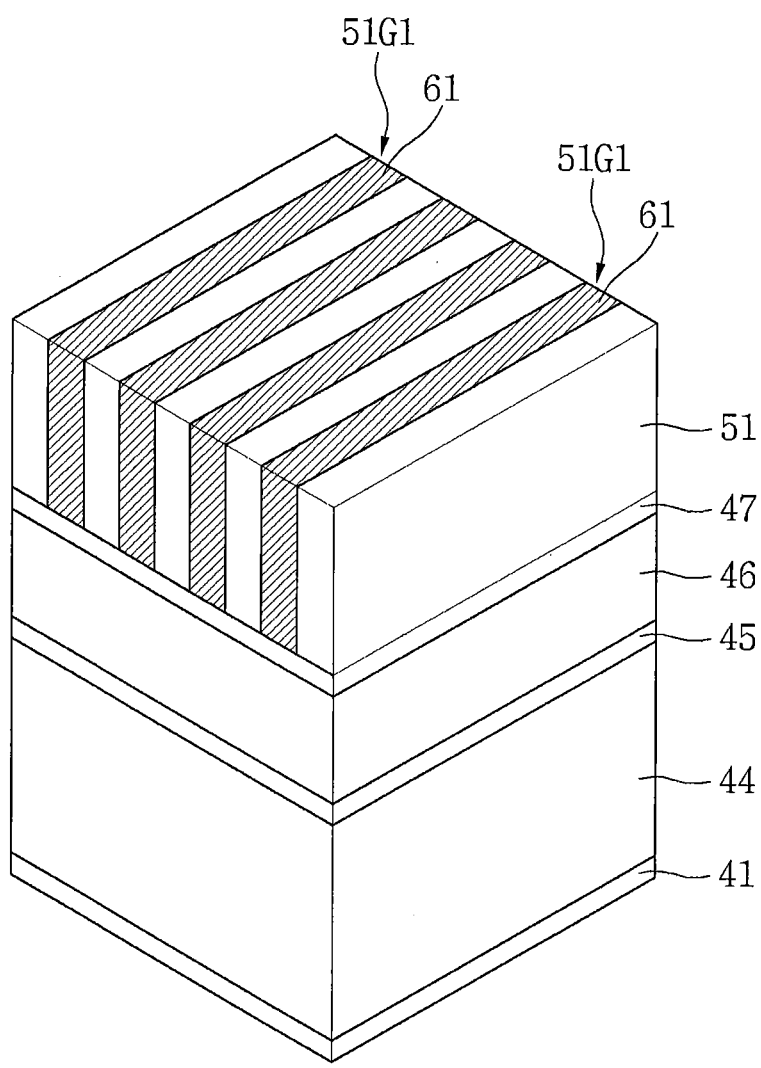

Referring to FIGS. 1 and 9, a plurality of first mask patterns 61 may be formed in parallel in the sacrificial layer 51 (B30). Each of the first mask patterns 61 may include a material more opaque than the sacrificial layer 51. The first mask patterns 61 may include materials each having an etch selectivity with respect to the sacrificial layer 51, the second support layer 47, the second molding layer 46, the first support layer 45 and the first molding layer 44. Each of the first mask patterns 61 may include polysilicon, a metal, a metal nitride or a combination thereof. For example, each of the first mask patterns 61 may include polysilicon.

A thin film forming process and a planarization process may be applied to form the first mask patterns 61. The planarization process may include a CMP process, an etch-back process or a combination thereof. The first mask patterns 61 may fill the first trenches 51G1. In some embodiments, the first mask patterns 61 may completely fill the first trenches 51G1. Upper surfaces of the first mask patterns 61 and the sacrificial layer 51 may be exposed at the substantially same plane. The first mask patterns 61 may have the same width. A height of each of the first mask patterns 61 may be greater than a width thereof. Each of the first mask patterns 61 may have a bar shape. The first mask patterns 61 may completely pass through the sacrificial layer 51. Lower ends of the first mask patterns 61 may contact the second support layer 47.

Figure 10:
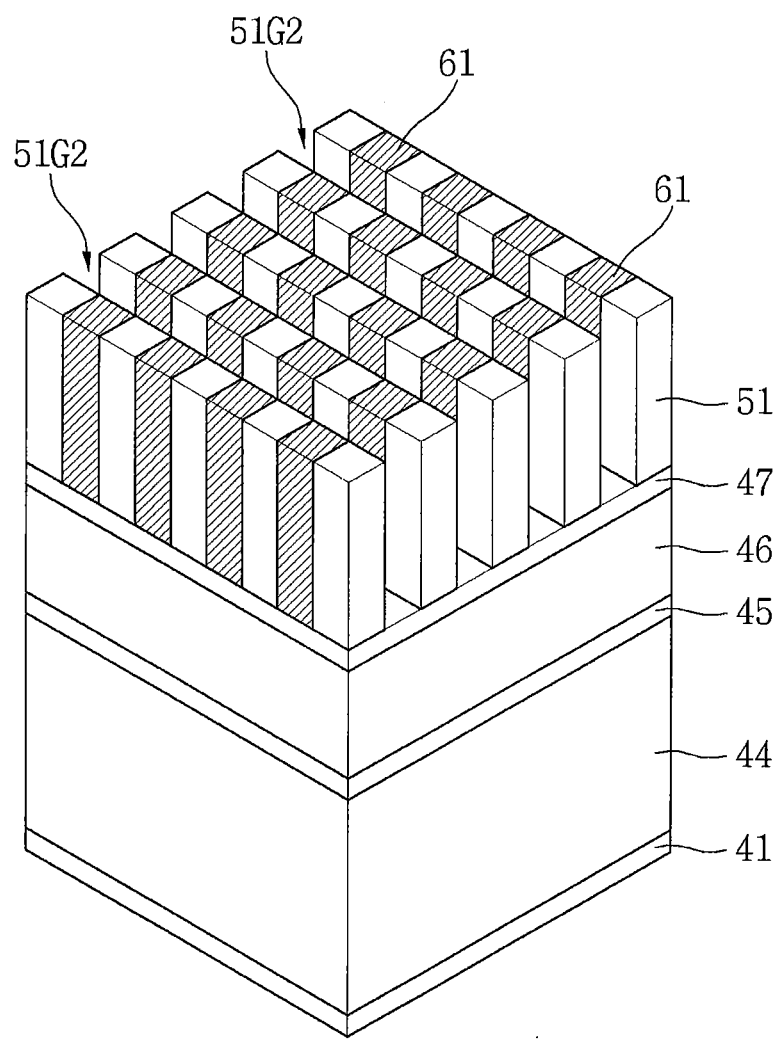

Referring to FIGS. 1 and 10, a plurality of second trenches 51G2, which pass through the sacrificial layer 51, may be formed. A patterning process similar to the process described with FIGS. 5 to 8 may be applied for forming the second trenches 51G2. The second trenches 51G2 may cross the first trenches 51G1, respectively. The second trenches 51G2 may be perpendicular to the first trenches 51G1, respectively. Each of the second trenches 51G2 may cross the sacrificial layer 51 and the first mask patterns 61. The second trenches 51G2 may completely pass through the sacrificial layer 51 and the first mask patterns 61. The second support layer 47 may be exposed at bottoms of the second trenches 51G2. The second trenches 51G2 may be in parallel. The second trenches 51G2 may have the same width. A height of each of the second trenches 51G2 may be greater than a width thereof. Each of the second trenches 51G2 may have a bar or groove shape.

In some example embodiments, each of the second trenches 51G2 may have an inverted trapezoidal shape in which a lower width thereof is smaller than an upper width thereof. Each of the second trenches 51G2 may be formed between the first mask patterns 61. The first mask patterns 61 may be partly recessed due to the second trenches 51G2. The first mask patterns 61 may remain at bottoms of the second trenches 51G2.

According to example embodiments of the inventive concepts, since the sacrificial layer 51 includes a transparent material, it may be very useful to determine alignment and overlay for the second trenches 51G2.

Figure 11:
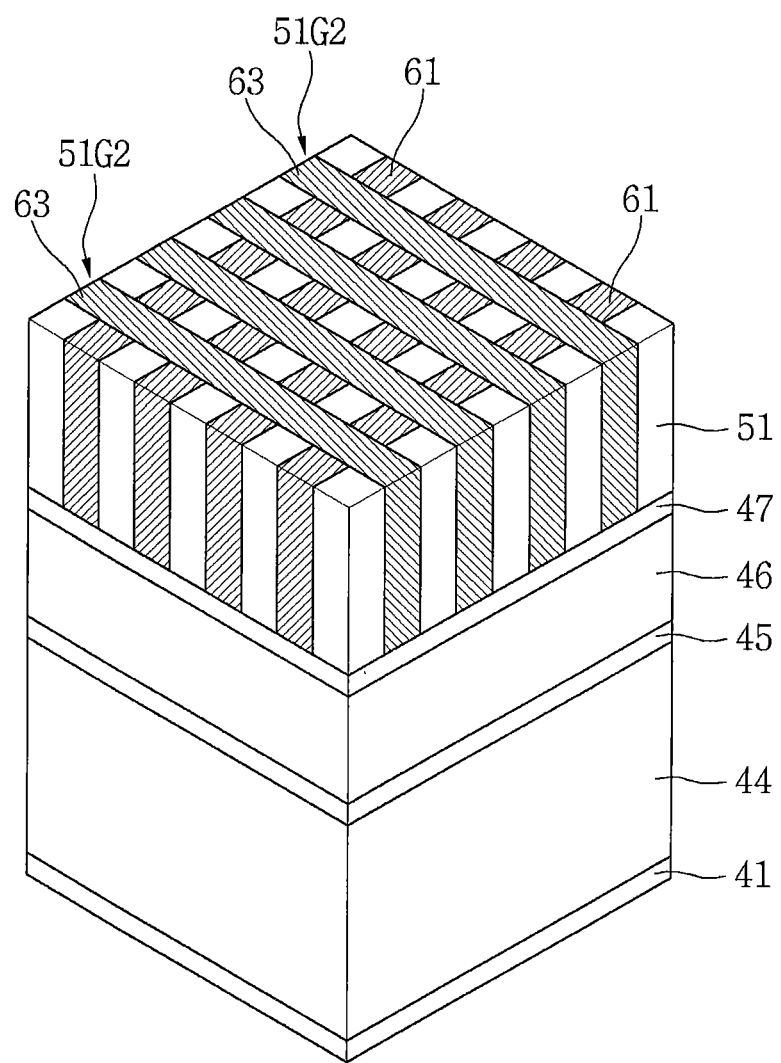

Referring to FIGS. 1 and 11, a plurality of second mask patterns 63 may be formed in parallel in the sacrificial layer 51 (B40). The second mask pattern 63 may include a material more opaque than the sacrificial layer 51. The second mask patterns 63 may include materials each having an etch selectivity with respect to the sacrificial layer 51, the second support layer 47, the second molding layer 46, the first support layer 45 and the first molding layer 44. The second mask pattern 63 may include polysilicon, a metal, a metal nitride or a combination thereof. The second mask patterns 63 may include the same material as the first mask patterns 61. For example, the second mask patterns 63 may include polysilicon.

A thin film forming process and a planarization process may be applied to form the second mask patterns 63. The planarization process may include a CMP process, an etch-back process or a combination thereof. The second mask patterns 63 may fill the second trenches 51G2. In some embodiments, the second mask patterns 63 may completely fill the second trenches 51G2. Upper surfaces of the second mask patterns 63, the first mask patterns 61, and the sacrificial layer 51 may be exposed at the substantially same plane. The second mask patterns 63 may have the same width. A height of each of the second mask patterns 63 may be greater than a width thereof. Each of the second mask patterns 63 may have a bar shape. The second mask patterns 63 may completely pass through the sacrificial layer 51. Lower ends of the second mask patterns 63 may contact the second support layer 47.

In some example embodiments, the second mask patterns 63 may include a material different from the first mask patterns 61.

Figure 12:
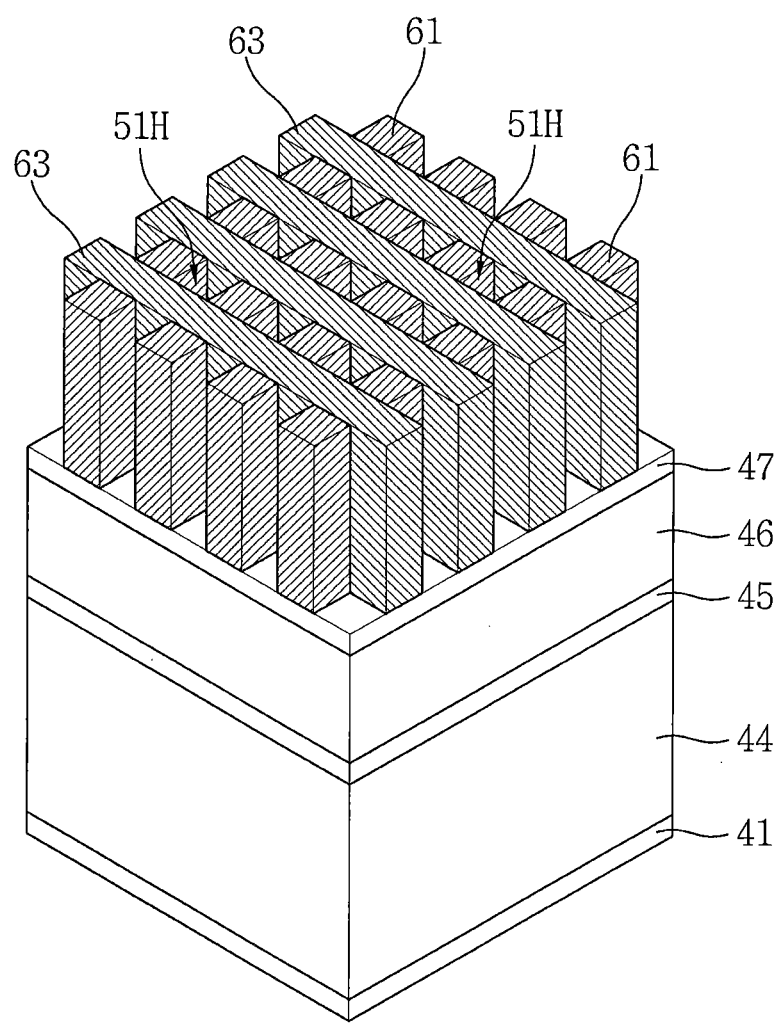

Referring to FIGS. 1 and 12, mask holes 51H may be formed between the first mask patterns 61 and the second mask patterns 63 by removing the sacrificial layer 51 (B50). The second support layer 47 may be exposed at bottoms of the mask holes 51H.

The first mask patterns 61 may be in parallel. The second mask patterns 63 may be in parallel. The second mask patterns 63 may cross the first mask patterns 61, respectively. The second mask patterns 63 may be perpendicular to the first mask patterns 61, respectively. The upper surfaces of the first mask patterns 61 and the second mask patterns 63 may be exposed at the substantially same plane.

FIGS. 13 to 16 are enlarged perspective views which may describe a partial configuration of FIG. 12.

Figure 13:
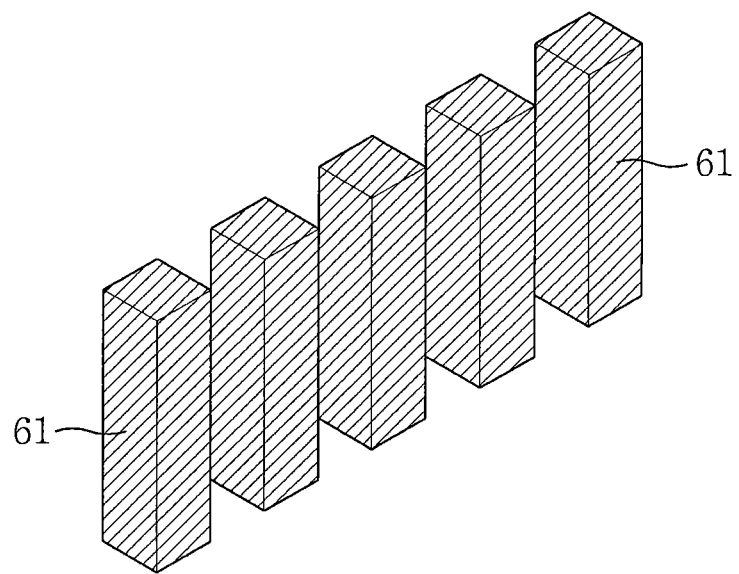
Figure 13:
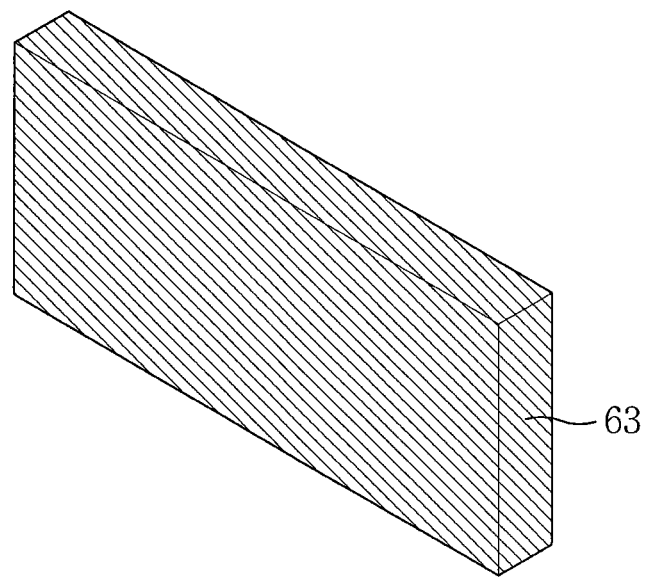

Referring to FIG. 13, an upper width of a first mask pattern 61 may be the same as a lower width thereof. An upper width of second mask pattern 63 may be the same as a lower width thereof. The second mask pattern 63 may completely pass through the first mask pattern 61. A height of the first mask pattern 61 may be greater than a width thereof. A height of the second mask pattern 63 may be greater than a width thereof.

Figure 14:
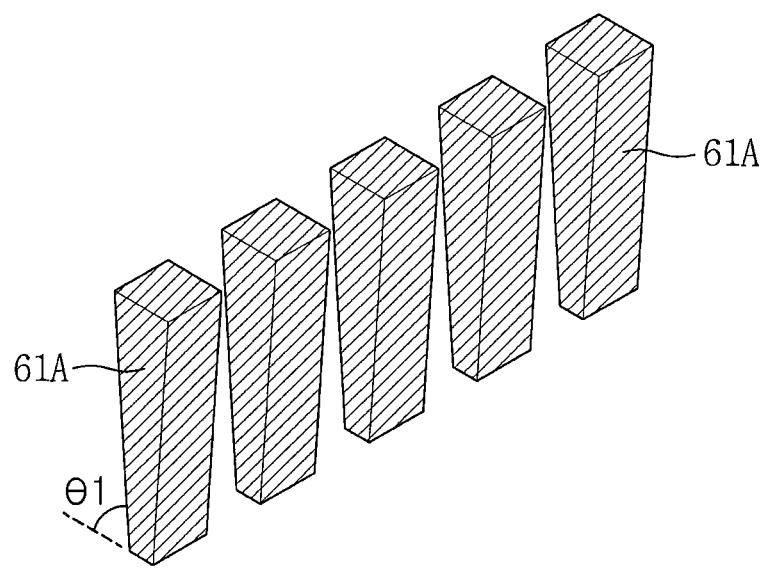
Figure 14:
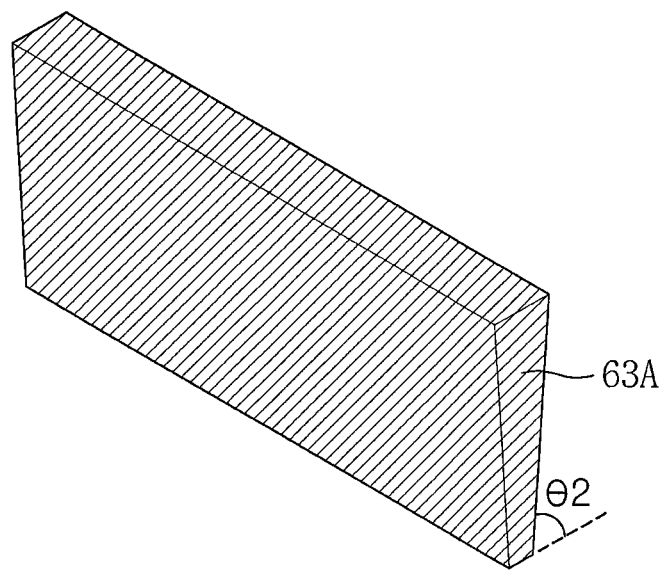

Referring to FIG. 14, a first mask pattern 61A may include a sloped side surface. The first mask pattern 61A may have an inverted trapezoidal shape in which a lower width thereof is smaller than an upper width thereof. A side surface of the first mask pattern 61A may have an inverted slope. The side surface of the first mask pattern 61A may have a first intersecting angle θ1 with respect to a horizontal line which passes a lower end of the first mask pattern 61A.

A second mask pattern 63A may include a sloped side surface. The second mask pattern 63A may have an inverted trapezoidal shape in which a lower width thereof is smaller than an upper width thereof. A side surface of the second mask pattern 63A may have an inverted slope. The side surface of the second mask pattern 63A may have a second intersecting angle θ2 with respect to a horizontal line which passes a lower end of the second mask pattern 63A. The second intersecting angle θ2 may be different from the first intersecting angle θ1.

In some example embodiments, the side surface of the second mask pattern 63A may have a profile different from the side surface of the first mask pattern 61A.

Figure 15:
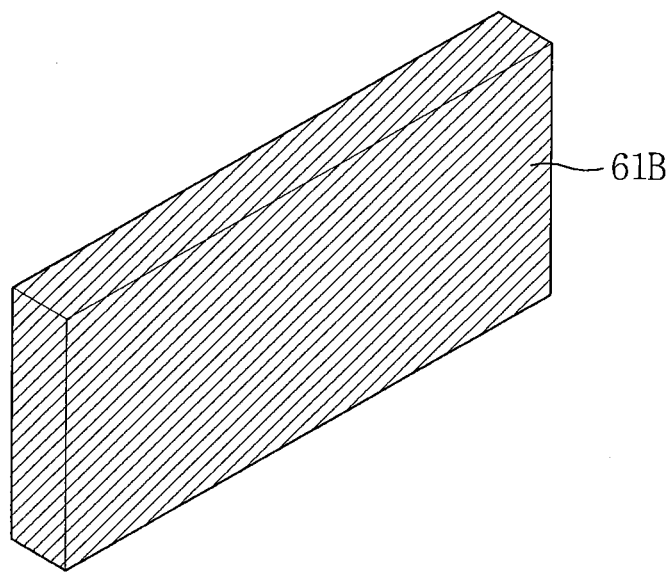
Figure 15:
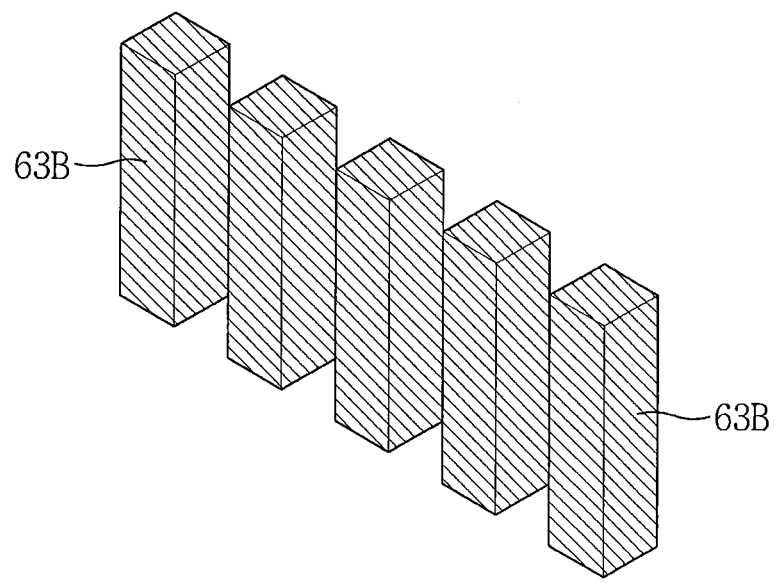

Referring to FIG. 15, a first mask pattern 61B may completely pass through a second mask pattern 63B.

Figure 16:
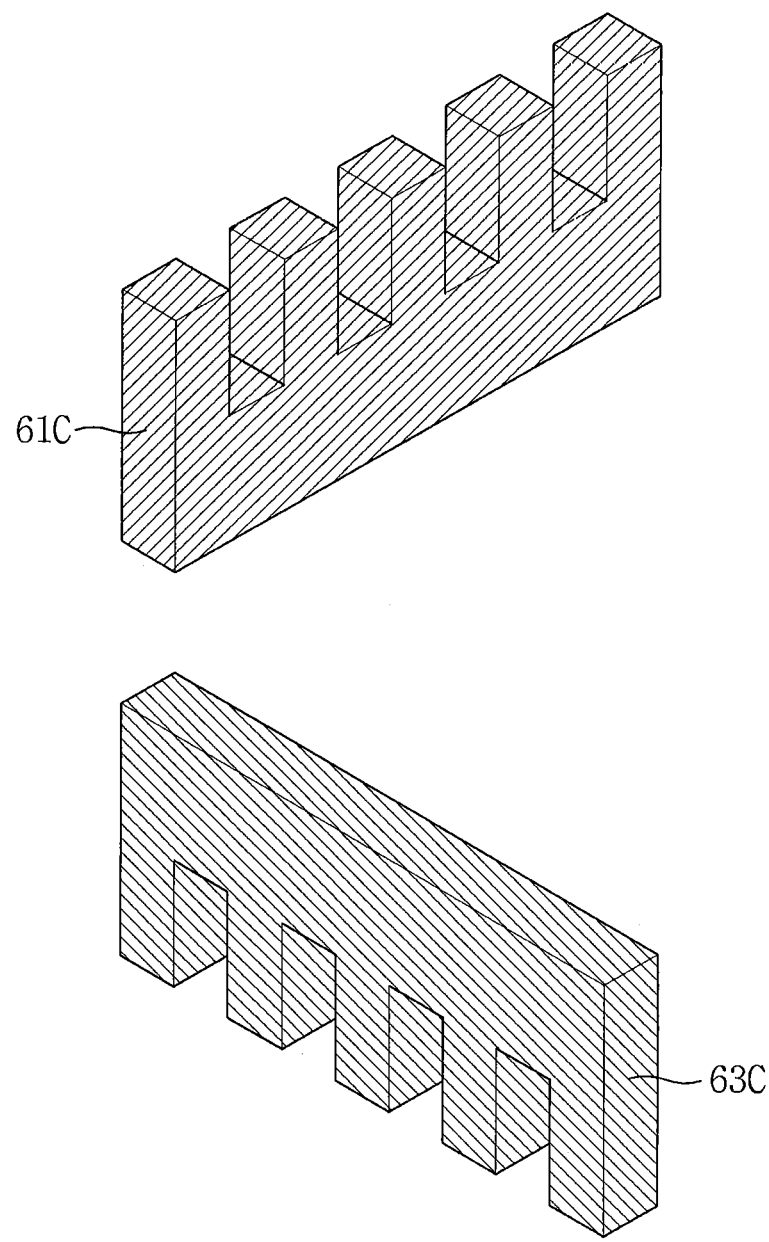

Referring to FIG. 16, a first mask pattern 61C may remain under a second mask pattern 63C.

Figure 17:
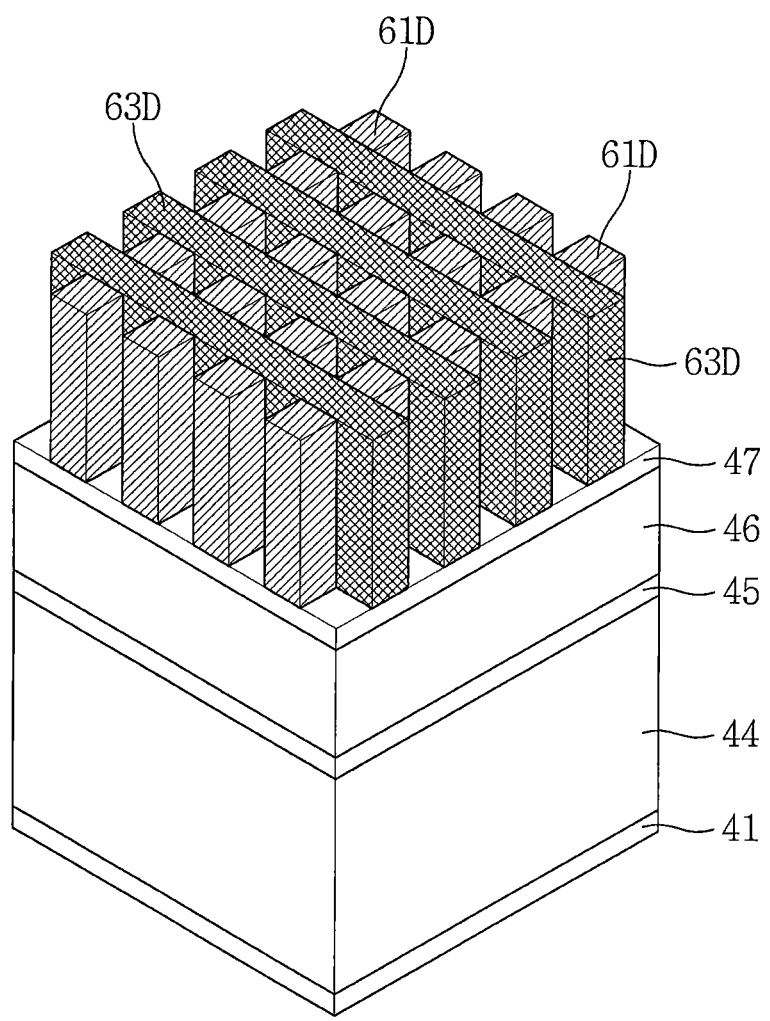
Figure 18:
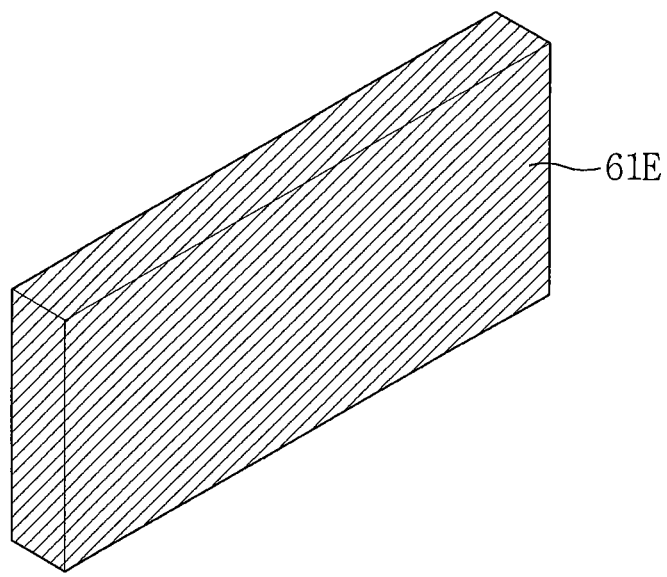
Figure 18:
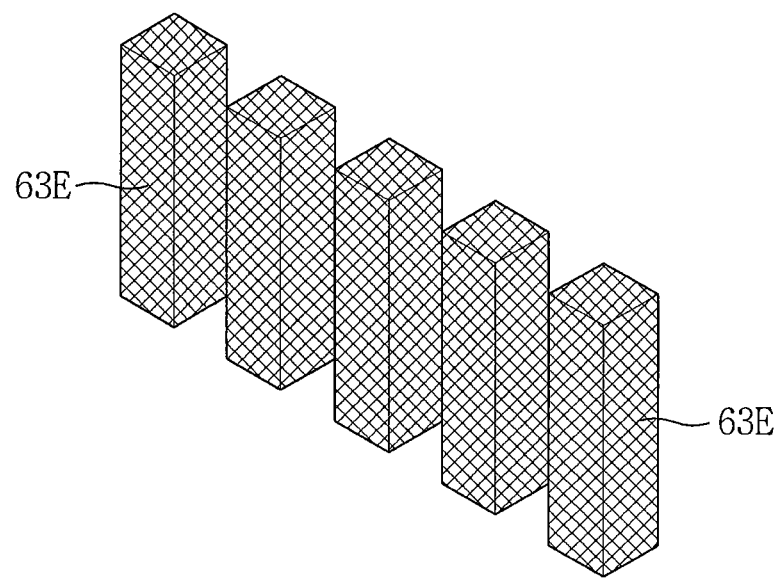
Figure 19:
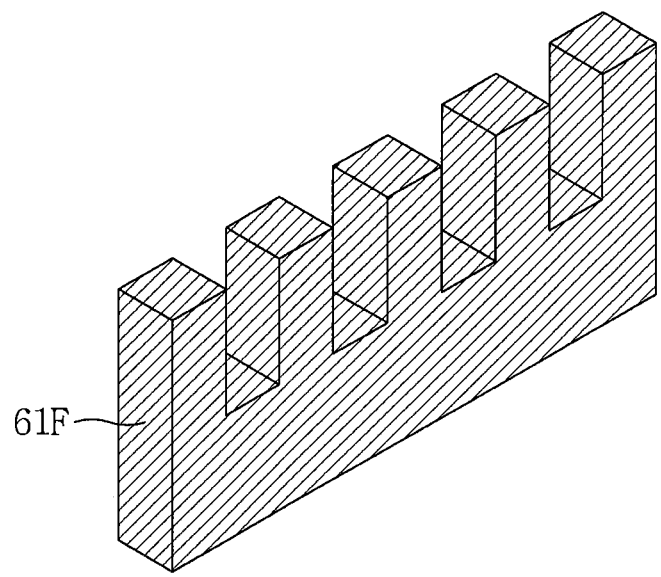
Figure 19:
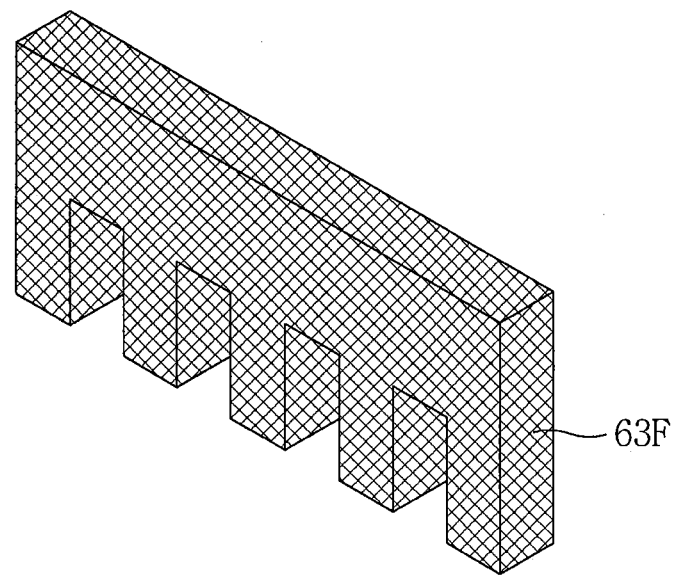

FIG. 17 is a perspective view in accordance with example embodiments of the inventive concepts, and FIGS. 18 and 19 are enlarged perspective views which may describe a partial configuration of FIG. 17.

Referring to FIGS. 17 to 19, second mask patterns 63D, 63E, and 63F may include materials different from first mask patterns 61D, 61E, and 61F.

Figure 20:
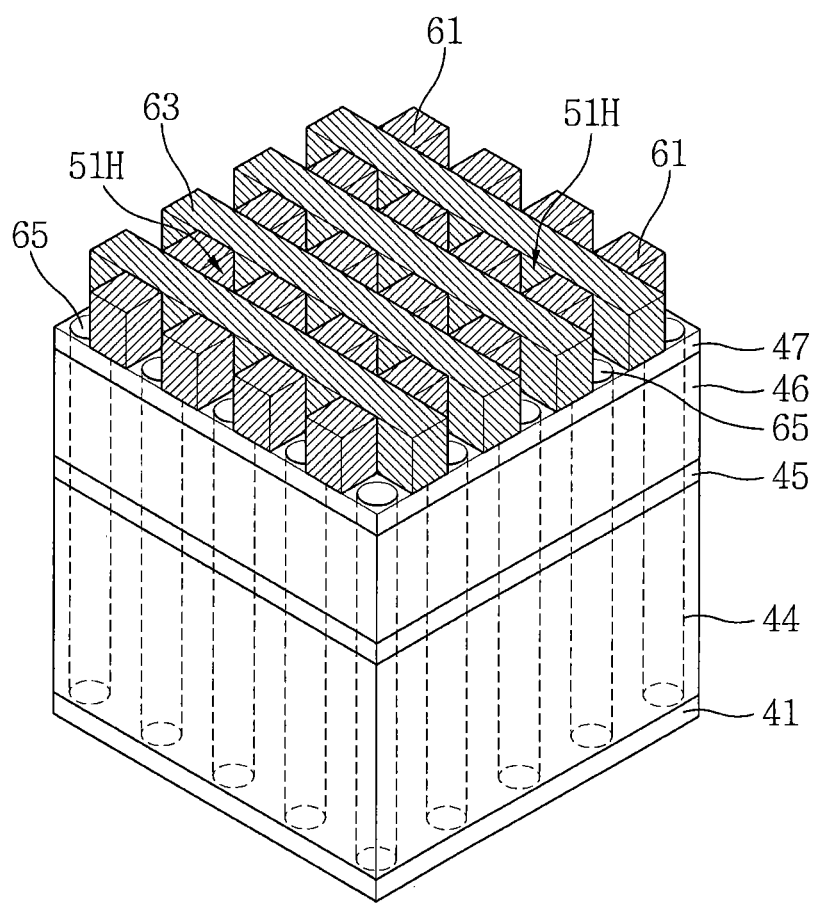

Referring to FIG. 1 and FIG. 20, a plurality of openings 65, which pass through the molding layers 44 and 46, may be formed by using the first mask patterns 61 and the second mask patterns 63 as etch masks (B60).

An anisotropic etching process may be applied to form the openings 65. Thicknesses of the first mask patterns 61 and the second mask patterns 63 may decrease while forming the openings 65. Each of the openings 65 may completely pass through the second support layer 47, the second molding layer 46, the first support layer 45 and the first molding layer 44. The openings 65 may be aligned with the mask holes 51H, respectively.

Figure 21:
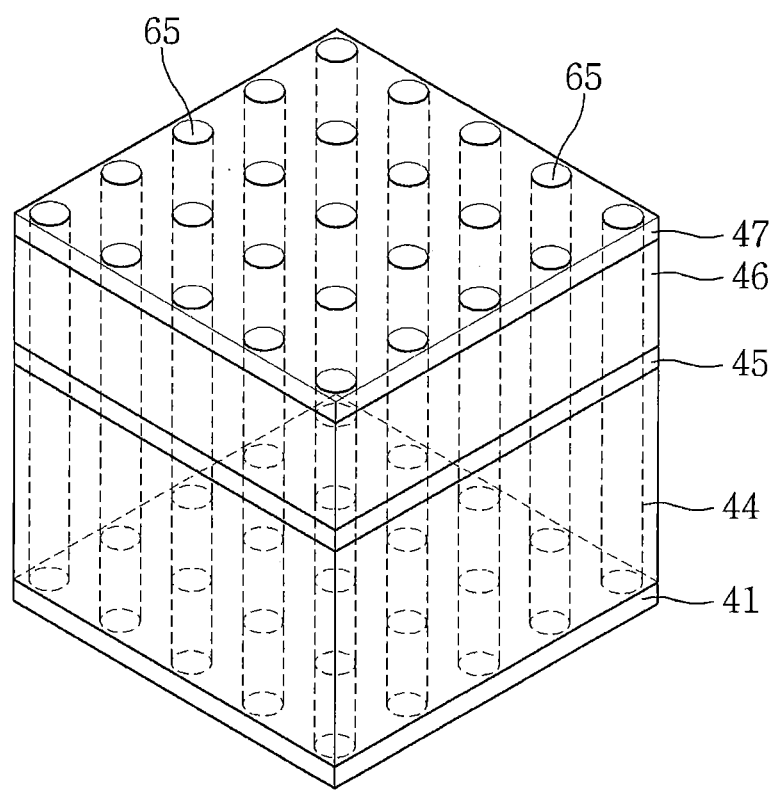
Figure 22:
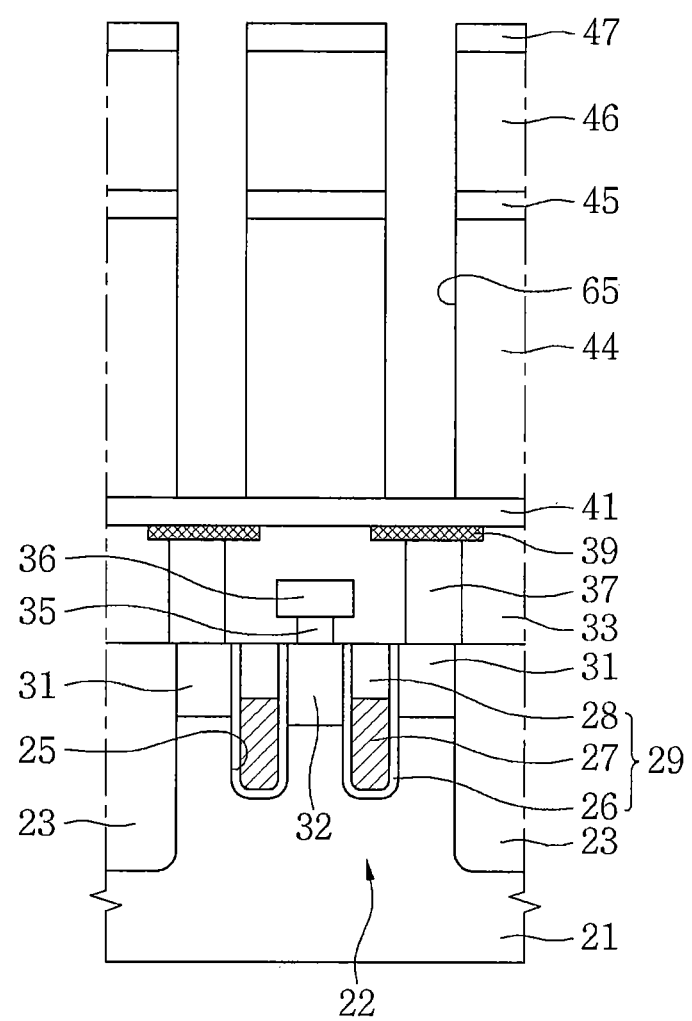

Referring to FIGS. 1, 21, and 22, an upper surface of the second support layer 47 may be exposed by removing the first mask patterns 61 and the second mask patterns 63. The etch-stop layer 41 may be exposed at bottoms of the openings 65.

Figure 23:
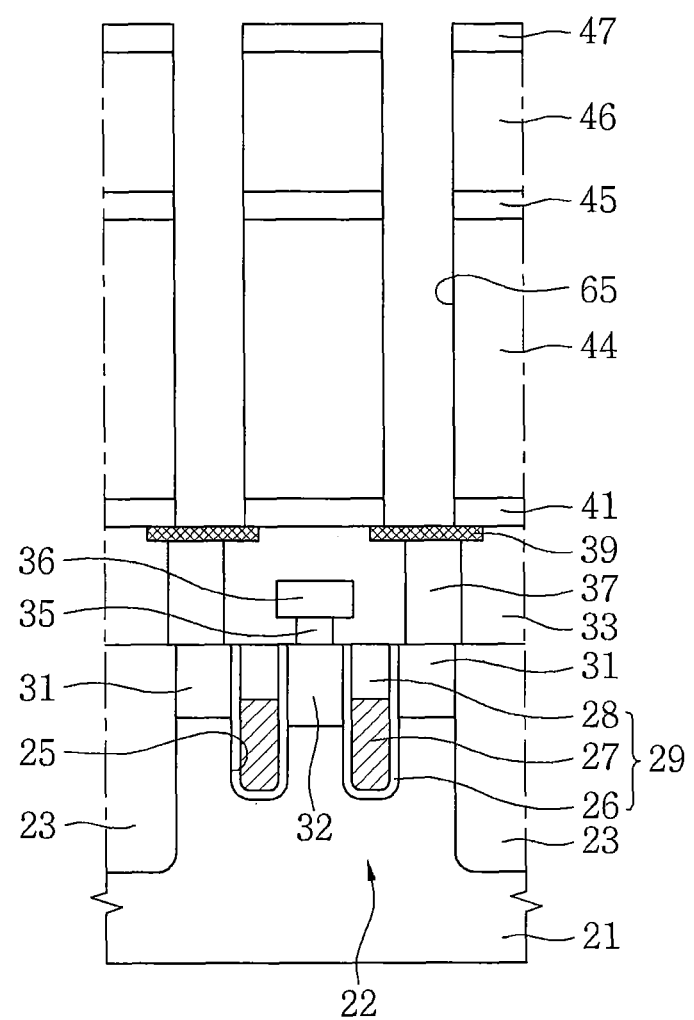

Referring to FIGS. 1 and 23, the landing pads 39 may be exposed at the bottoms of the openings 65 by partly removing the etch-stop layer 41. Each of the openings 65 may have a high aspect ratio. For example, each of the openings 65 may have an aspect ratio in a range of 10:1 to 30:1.

In some example embodiments, a process, which exposes the landing pads 39 at the bottoms of the openings 65 by partly removing the etch-stop layer 41, may be performed before removing the first mask patterns 61 and the second mask patterns 63.

Figure 24:
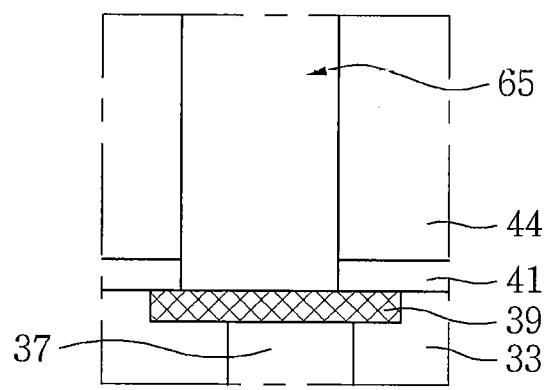
Figure 25:
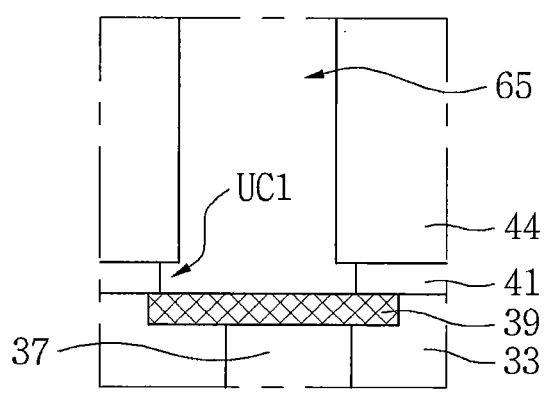

FIGS. 24 and 25 are enlarged cross-sectional views for showing a part of FIG. 23 in detail.

Referring to FIG. 24, a side surface of the etch-stop layer 41 may be vertically aligned with a side surface of the first molding layer 44.

Referring to FIG. 25, an undercut region UC1 may be formed under the first molding layer 44. A side surface of the etch-stop layer 41 may not be aligned with a side surface of the first molding layer 44.

Figure 26:
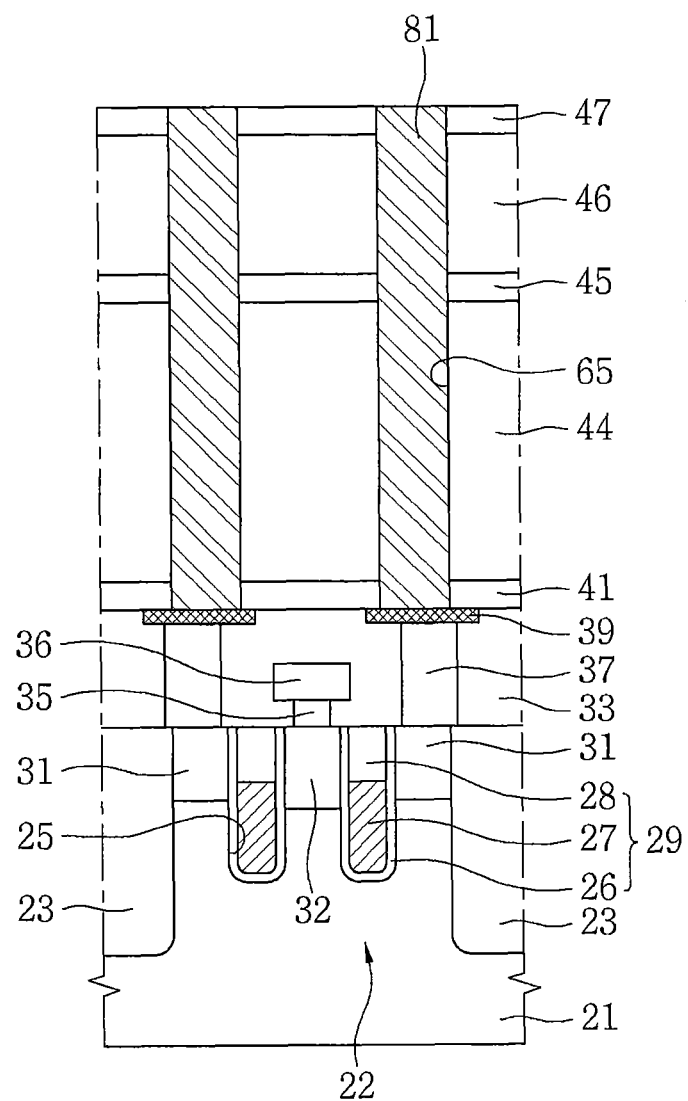

Referring to FIGS. 1 and 26, lower electrodes 81 may be formed in the openings 65 (B70). A thin film forming process and a planarization process may be applied to form the lower electrodes 81. The lower electrodes 81 may fill the openings 65, respectively. In some embodiments, the lower electrodes 81 may completely fill the openings 65, respectively. The lower electrodes 81 may contact the landing pads 39, respectively. Each of the lower electrodes 81 may include a metal layer such as, for example, an Ru layer, an RuO layer, a Pt layer, a PtO layer, an Ir layer, an IrO layer, an SRO(SrRuO) layer, a BSRO((Ba, Sr)RuO) layer, a CRO(CaRuO) layer, a BaRuO layer, an La(Sr,Co O) layer, a Ti layer, a TiN layer, a W layer, a WN layer, a Ta layer, a TaN layer, a TiAlN layer, a TiSiN layer, a TaAlN layer, a TaSiN layer or a combination thereof.

Figure 27:
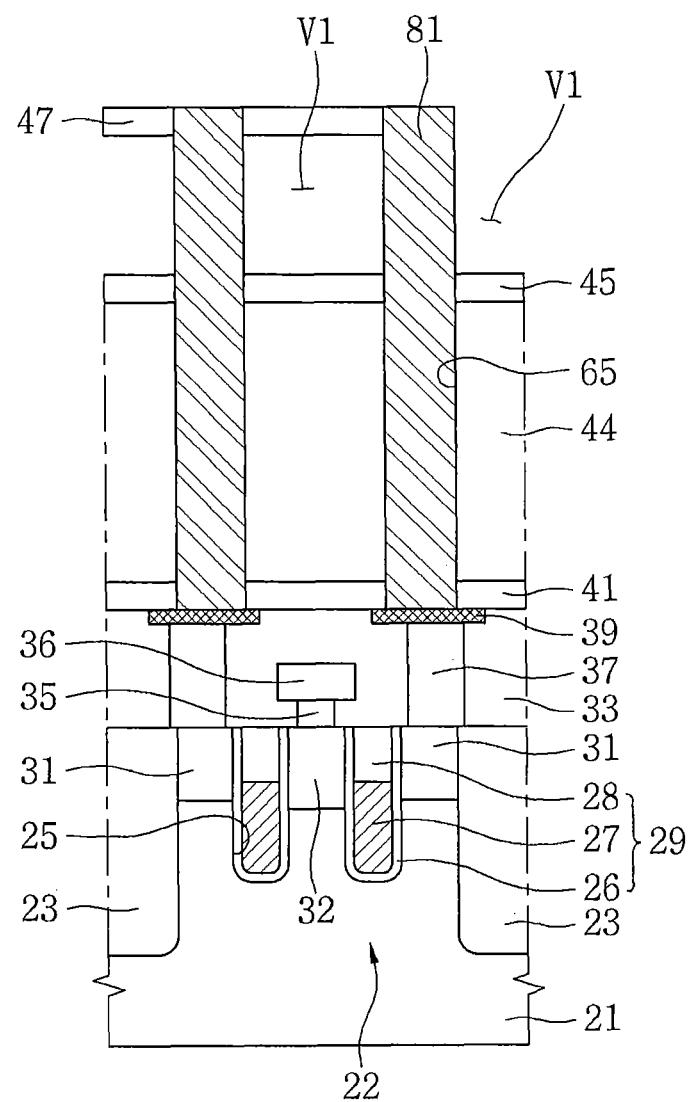

Referring to FIG. 27, an upper space V1 may be formed on the first support layer 45, by partly removing the second support layer 47 and removing the second molding layer 46. The second support layer 47 may remain between the lower electrodes 81. The second support layer 47 may contact the lower electrodes 81.

Figure 28:
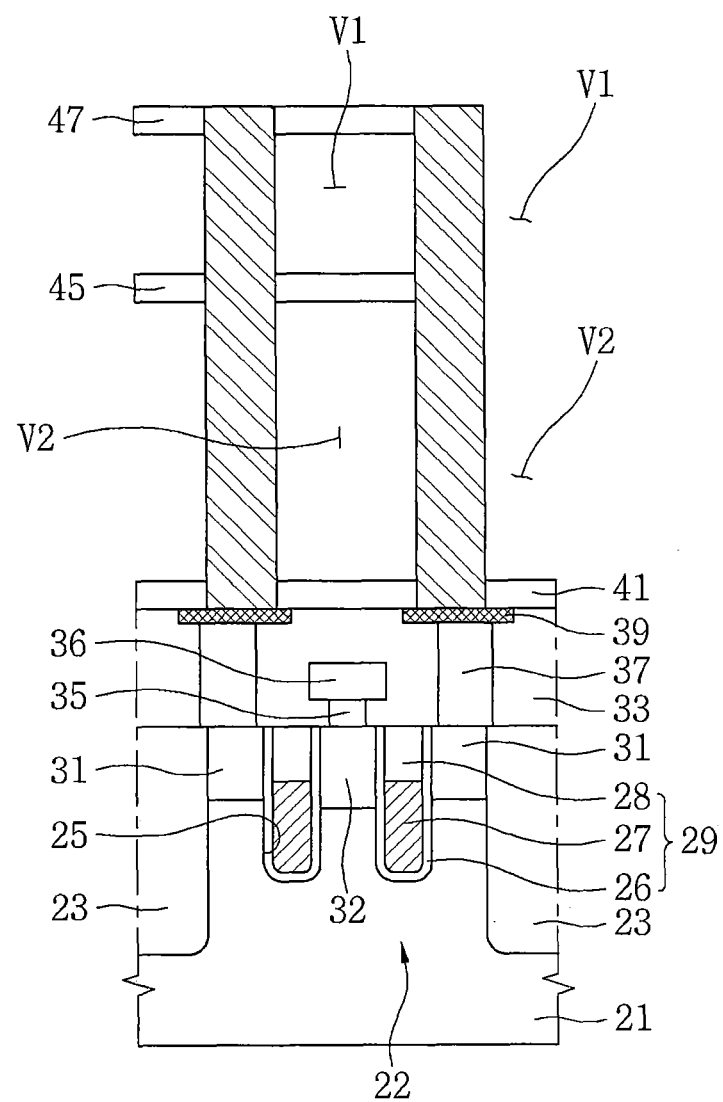

Referring to FIG. 28, a lower space V2 may be formed on the etch-stop layer 41, by partly removing the first support layer 45 and removing the first molding layer 44. The lower space V2 may be connected to the upper space V1. The first support layer 45 may remain between the lower electrodes 81. The first support layer 45 may contact the lower electrodes 81. Side surfaces of the lower electrodes 81 may be exposed.

Figure 29:
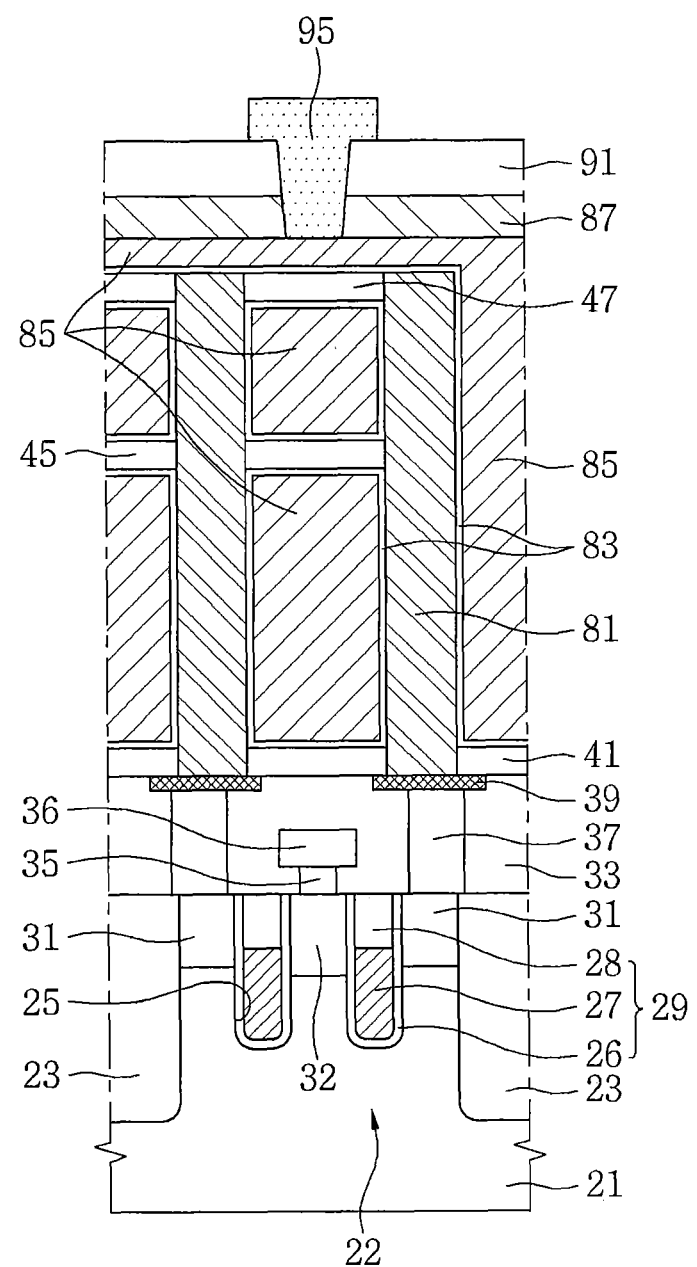

Referring to FIG. 29, a capacitor dielectric layer 83, which conformally covers surfaces of the lower electrodes 81, the first support layer 45 and the second support layer 47, may be formed. An upper electrode 85 may be formed on the capacitor dielectric layer 83. The upper electrode 85 may fill the lower space V2 and the upper space V1 and may cover the second support layer 47, the first support layer 45 and the capacitor dielectric layer 83.

The capacitor dielectric layer 83 may include a TaO layer, a TaAlO layer, a TaON layer, an AlO layer, an HfO layer, a ZrO layer, a ZrSiO layer, a TiO layer, a TiAlO layer, a BST ((Ba,Sr)TiO) layer, an STO(SrTiO) layer, a BTO(BaTiO) layer, a PZT(Pb(Zr,Ti)O) layer, a (Pb,La)(Zr,Ti)O layer, a Ba(Zr,Ti)O layer, an Sr(Zr,Ti)O layer, or a combination thereof. The upper electrode 85 may include a metal layer such as, for example, an Ru layer, an RuO layer, a Pt layer, a PtO layer, an Ir layer, an IrO layer, an SRO(SrRuO) layer, a BSRO((Ba,Sr)RuO) layer, a CRO(CaRuO) layer, a BaRuO layer, an La(Sr,Co)O layer, a Ti layer, a TiN layer, a W layer, a WN layer, a Ta layer, a TaN layer, a TiAlN layer, a TiSiN layer, a TaAlN layer, a TaSiN layer or a combination thereof.

A conductive layer 87 may be formed on the upper electrode 85. An upper insulating layer 91 may be formed on the conductive layer 87. A wiring 95 may be formed on the upper insulating layer 91. The wiring 95 may pass through the upper insulating layer 91 and the conductive layer 87 and may contact the upper electrode 85.

The conductive layer 87 may include a metal, a metal nitride, a metal silicide, a semiconductor or a combination thereof. The conductive layer 87 may include a material having an etch selectivity with respect to the upper electrode 85. For example, the conductive layer 87 may include SiGe. The upper insulating layer 91 may include silicon oxide, silicon nitride, silicon oxynitride or a combination thereof. The wiring 95 may include a metal, a metal nitride, conductive carbon or a combination thereof.

FIGS. 30 to 35 are cross-sectional views for describing a method of forming a semiconductor device in accordance with example embodiments of the inventive concepts.

Figure 30:
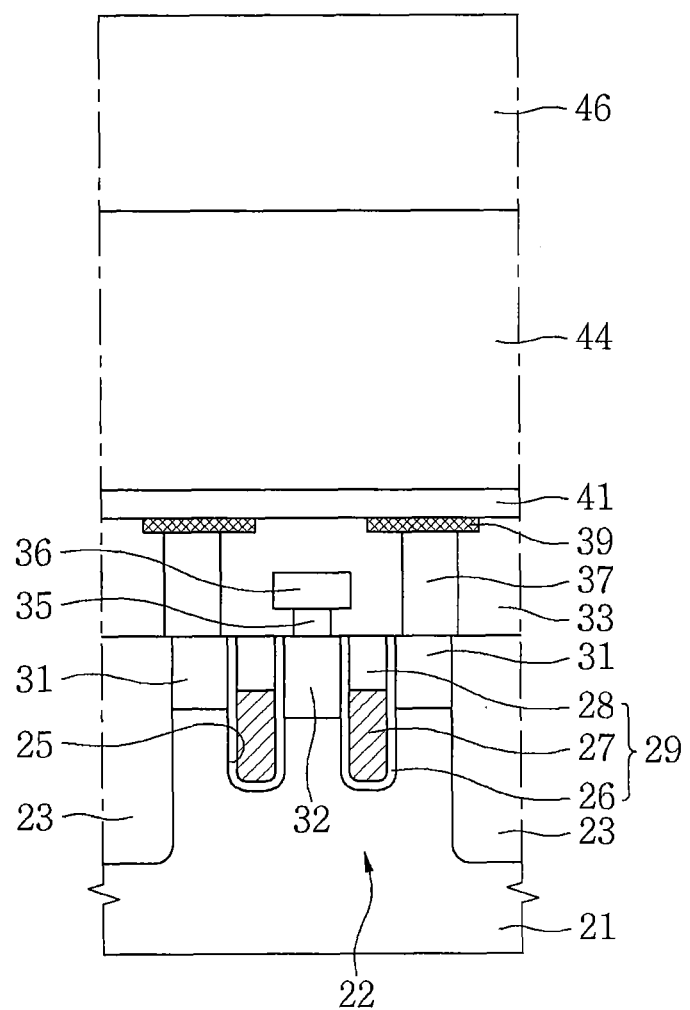
FIGS. 30 to 35 are cross-sectional views for describing a method of forming a semiconductor device in accordance with example embodiments of the inventive concepts.

Referring to FIG. 30, device isolation layers 23, which define an active region 22 in a substrate 21, may be formed. Gate trenches 25, which cross the active region 22, may be formed. Gate structures 29 may be formed in the gate trenches 25. Each of the gate structures 29 may include a gate dielectric layer 26, a gate electrode 27, and a gate capping pattern 28. First and second source/drain regions 31 and 32 may be formed in the active region 22 adjacent to the gate structures 29.

An interlayer insulating layer 33 may be formed on the gate structures 29 and the first and second source/drain regions 31 and 32. A bit line plug 35 and a bit line 36 may be formed in the interlayer insulating layer 33. Buried contact plugs 37, which pass through the interlayer insulating layer 33 and respectively contact the first source/drain regions 31, may be formed. Landing pads 39 may be formed on the buried contact plugs 37.

An etch-stop layer 41 may be formed on the interlayer insulating layer 33 and the landing pads 39. A first molding layer 44 may be formed on the etch-stop layer 41. A second molding layer 46 may be formed on the first molding layer 44. The second molding layer 46 may be thinner than the first molding layer 44. The second molding layer 46 may include a material having an etch rate lower than the first molding layer 44. For example, the first molding layer 44 may include TEOS, and the second molding layer 46 may include HDP oxide.

Figure 31:
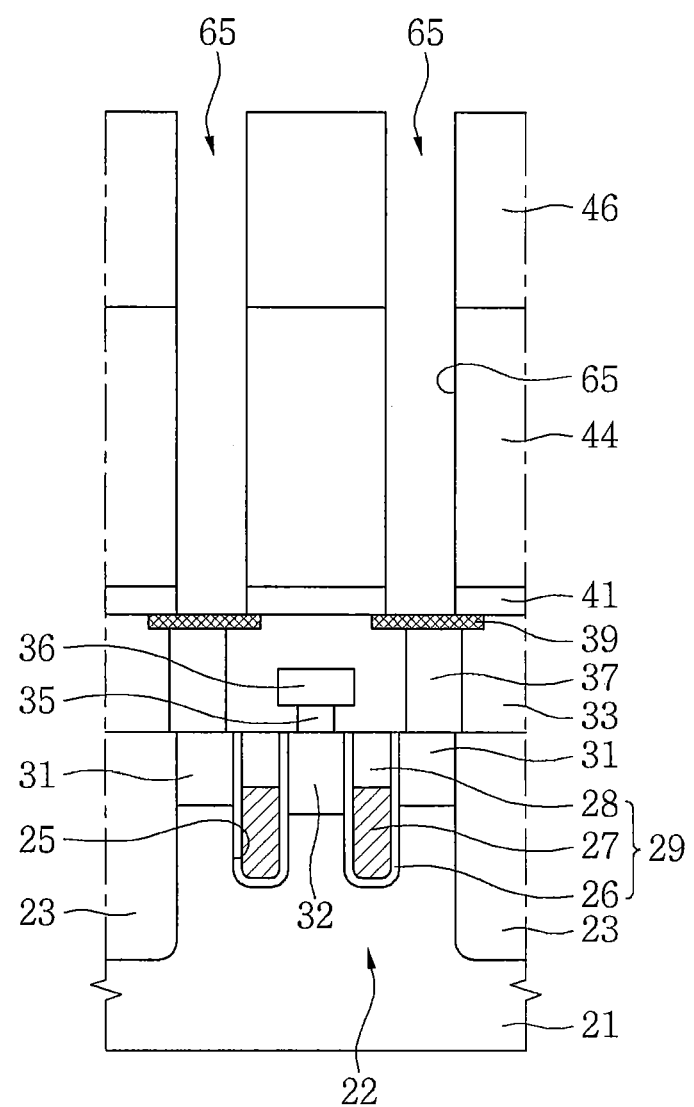

Referring to FIG. 31, a plurality of openings 65, which pass through the second molding layer 46, the first molding layer 44 and the etch-stop layer 41, may be formed. The formation of the openings 65 may include a process similar to the process described with reference to FIGS. 1 to 25.

Figure 32:
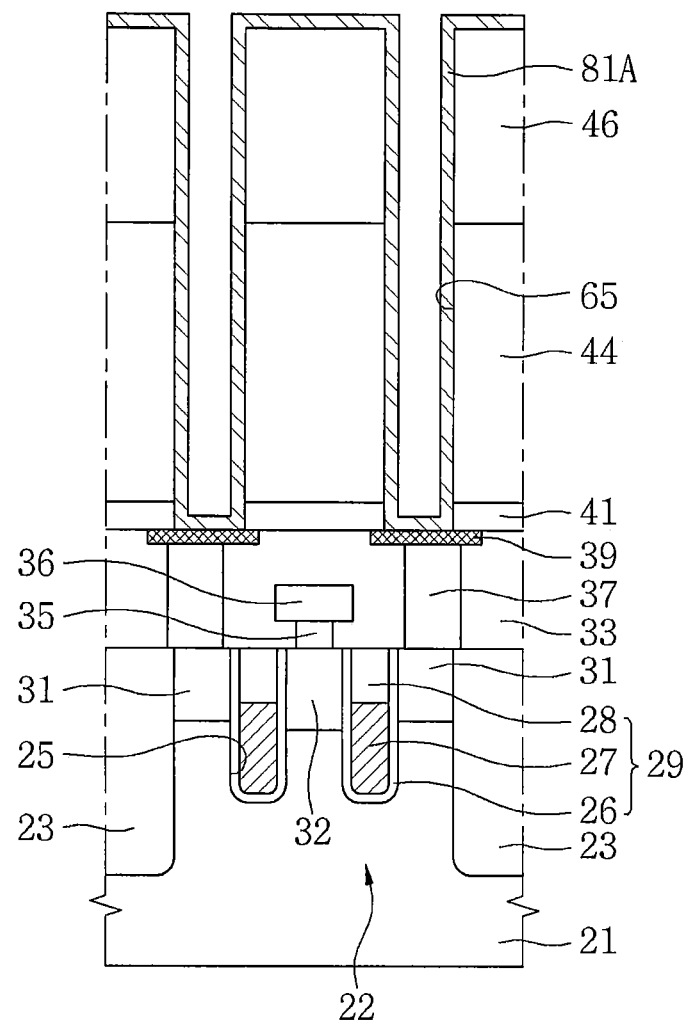

Referring to FIG. 32, a lower electrode 81A, which covers inside walls of the openings 65 and covers the second molding layer 46, may be formed. The lower electrode 81A may contact the landing pads 39. The lower electrode 81A may uniformly and densely cover the inside walls of the openings 65. The lower electrode 81A may directly contact the etch-stop layer 41, the first molding layer 44, and the second molding layer 46.

Figure 33:
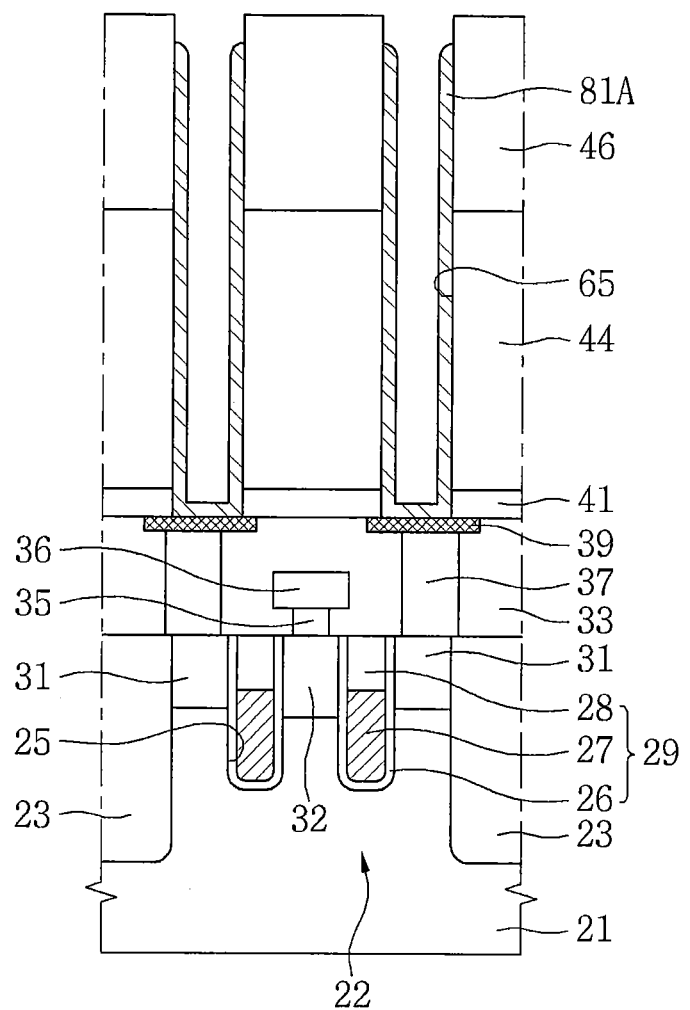

Referring to FIG. 33, upper ends of the second molding layer 46 may be exposed by partly removing the lower electrode 81A using an etch-back process. An anisotropic etching process may be applied to partially remove the lower electrode 81A. The lower electrode 81A may remain inside the openings 65. A side surface of the second molding layer 46 may be partly exposed at upper end regions of the openings 65. An upper end of the lower electrode 81A may remain at a level lower than an upper end of the second molding layer 46. Due to a high aspect ratio of the openings 65, the lower electrode 81A may remain on the landing pads 39 while performing the etch-back process.

Figure 34:
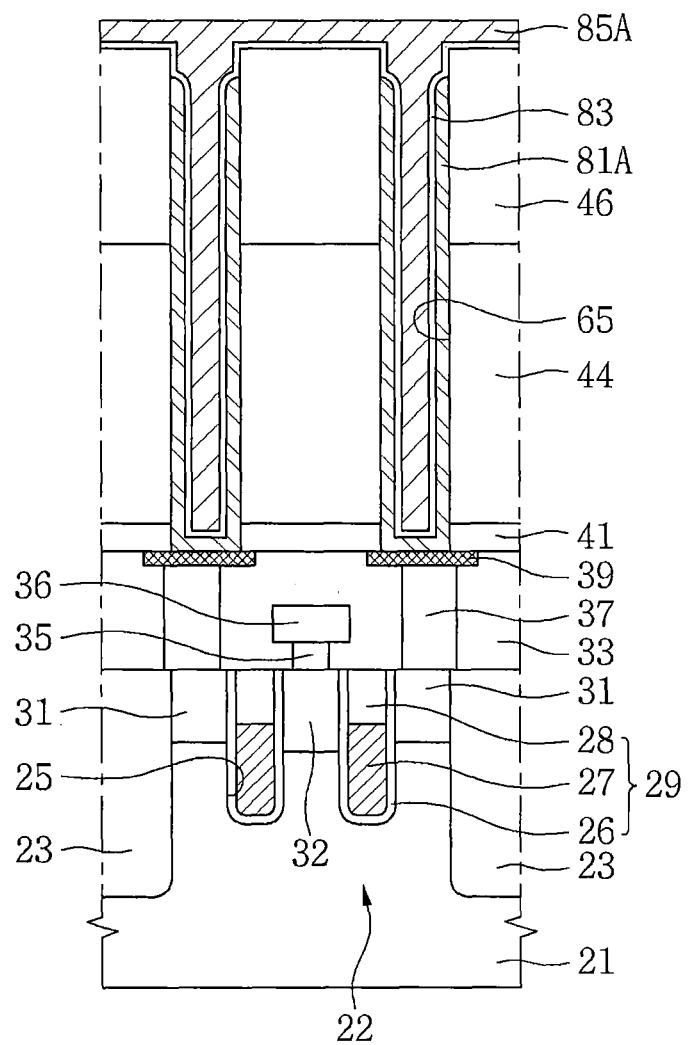

Referring to FIG. 34, a capacitor dielectric layer 83 may be formed on the lower electrode 81A. The capacitor dielectric layer 83 may cover the lower electrode 81A and the second molding layer 46. The capacitor dielectric layer 83 may directly contact the lower electrode 81A and the second molding layer 46. The capacitor dielectric layer 83 may directly contact upper and side surfaces of the second molding layer 46.

An upper electrode 85A may be formed on the capacitor dielectric layer 83. The upper electrode 85A may directly contact the capacitor dielectric layer 83. The upper electrode 85A may fill the openings 65 and may cover the second molding layer 46. The capacitor dielectric layer 83 may be interposed between the lower electrode 81A and the upper electrode 85A.

Figure 35:
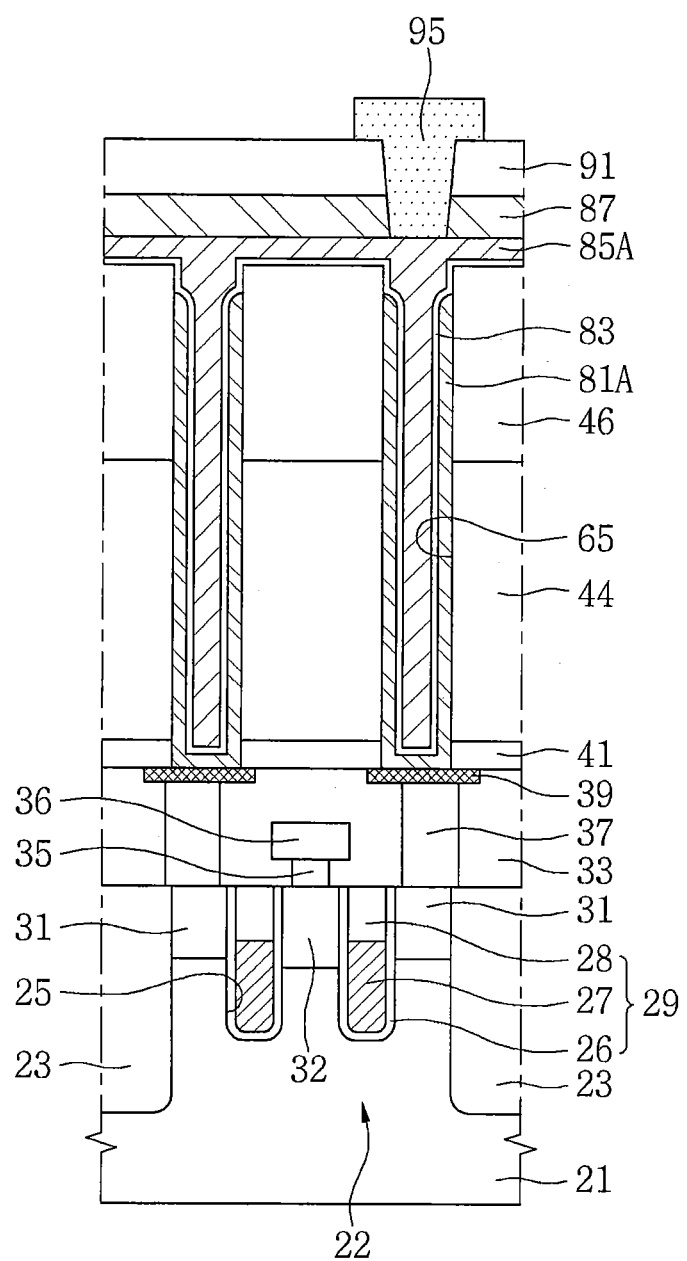

Referring to FIG. 35, a conductive layer 87 may be formed on the upper electrode 85A. An upper insulating layer 91 may be formed on the conductive layer 87. A wiring 95 may be formed on the upper insulating layer 91. The wiring 95 may connect the upper electrode 85A.

In some example embodiments, the first molding layer 44 and the second molding layer 46 may be removed. At least one support layer may be formed between the lower electrodes 81A. The capacitor dielectric layer 83 may cover outside surfaces of the lower electrodes 81A. The upper electrode 85A may extend between the lower electrodes 81A.

Figure 36:
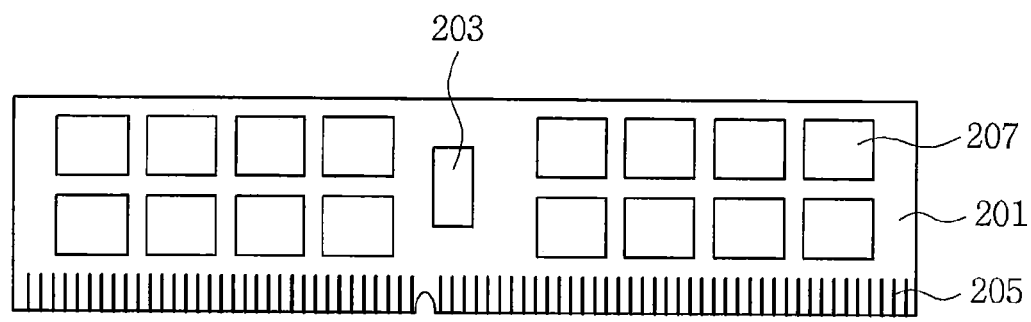
FIG. 36 is a layout for describing a semiconductor module in accordance with example embodiments of the inventive concepts.

FIG. 36 is a layout for describing a semiconductor module in accordance with example embodiments of the inventive concepts.

Referring to FIG. 36, the semiconductor module in accordance with example embodiments of the inventive concepts may include a module substrate 201, a plurality of semiconductor packages 207, and a control chip package 203. Input/output terminals 205 may be formed on the module substrate 201. The semiconductor packages 207 may include a configuration similar to the configuration described with reference to FIGS. 1 to 35. The semiconductor packages 207 and the control chip package 203 may be mounted on the module substrate 201. The semiconductor packages 207 and the control chip package 203 may be electrically connected to the input/output terminals 205 in series and/or parallel.

In some embodiments, the control chip package 203 may be omitted. The semiconductor packages 207 may include a dynamic random access memory (DRAM). The semiconductor module according to the example embodiments of the inventive concepts may be a memory module.

Figure 37:
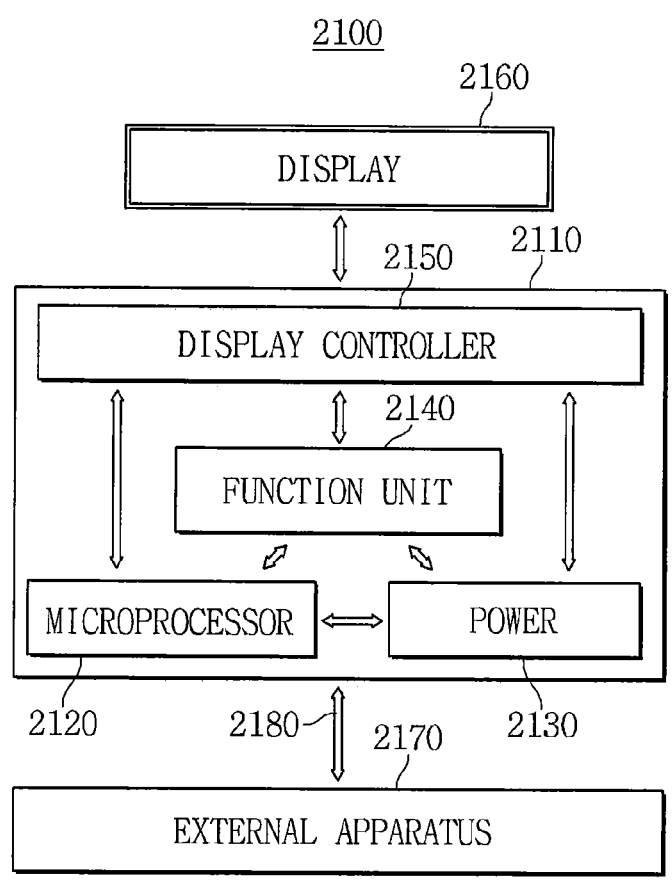
FIG. 37 is a system block diagram of electronic apparatuses in accordance with example embodiments of the inventive concepts.

FIG. 37 is a system block diagram of electronic apparatuses in accordance with example embodiments of the inventive concepts.

Referring to FIG. 37, a semiconductor device similar to the device described with reference to FIGS. 1 to 35 may be applied to an electronic system 2100. The electronic system 2100 may include a body 2110, a microprocessor unit 2120, a power unit 2130, a function unit 2140, and a display controller unit 2150. The body 2110 may be a motherboard formed by a printed circuit board (PCB). The microprocessor unit 2120, the power unit 2130, the function unit 2140 and the display controller unit 2150 may be mounted on the body 2110. A display unit 2160 may be disposed inside or outside the body 2110. For example, the display unit 2160 may be disposed on a surface of the body 2110 and may display an image processed by the display controller unit 2150.

The power unit 2130 may receive a predetermined voltage from an external battery or the like, may divide the voltage into required voltage levels and may serve to supply those voltages to the microprocessor unit 2120, the function unit 2140, the display controller unit 2150, etc. The microprocessor unit 2120 may receive a voltage from the power unit 2130 and may control the function unit 2140 and the display unit 2160. The function unit 2140 may perform various functions of the electronic system 2100. For example, when the electronic system 2100 is a smart phone, the function unit 2140 may include dialing or various types of components capable of performing handset functions such as displaying an image to the display unit 2160, outputting a voice to a speaker, or the like by communication with an external apparatus 2170, and when a camera is mounted therein, it may serve as a camera image processor.

In an implementation embodiment, when the electronic system 2100 is connected to a memory card or the like to expand a capacity thereof, the function unit 2140 may be a memory card controller. The function unit 2140 may transmit/receive signals to/from the external apparatus 2170 through a wired or wireless communication unit 2180. When the electronic system 2100 needs a Universal Serial Bus (USB) or the like to expand functions thereof, the function unit 2140 may serve as an interface controller. The function unit 2140 may include a mass storage apparatus.

A semiconductor device similar to the device described with reference to FIGS. 1 to 35 may be applied to the function unit 2140.

In accordance with example embodiments of the inventive concepts, a sacrificial layer may be formed of a transparent material on a molding layer. A plurality of first trenches may be formed in parallel by patterning the sacrificial layer. A first mask patterns may be formed of an opaque material in the first trenches. A plurality of second trenches, which cross the first trenches and are in parallel, may be formed by patterning the sacrificial layer. A second mask patterns may be formed of an opaque material in the second trenches. The sacrificial layer may be removed. A plurality of openings, which pass through the molding layer may be formed using the first mask patterns and the second mask patterns as etch masks. Electrodes may be formed in the openings. The sacrificial layer formed of the transparent material can be very useful to determine alignment and overlay in a patterning process. A method of forming a semiconductor device capable of overcoming the limit of the patterning process and maximizing an aspect ratio of each of the openings can be provided. Furthermore, a semiconductor device capable of maximizing capacitance of a capacitor within a limited area can be embodied.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming a semiconductor device comprising:
   forming a molding layer on a substrate;
   forming a sacrificial layer on the molding layer;
   forming a plurality of first mask patterns in parallel in the sacrificial layer;
   forming a plurality of second mask patterns, which cross the plurality of first mask patterns and are in parallel, in the sacrificial layer, wherein the plurality of first mask patterns and the plurality of second mask patterns comprise materials more opaque than the sacrificial layer, and upper surfaces of the sacrificial layer, the plurality of first mask patterns and the plurality of second mask patterns are disposed at an equal horizontal level;
   removing the sacrificial layer;
   forming a plurality of openings, which pass through the molding layer, using the plurality of first mask patterns and the plurality of second mask patterns as etch masks; and
   forming a plurality of electrodes in the plurality of openings.

2. The method of claim 1, wherein each of the plurality of first mask patterns and the plurality of second mask patterns comprises a sloped side surface, and the side surfaces of the plurality of second mask patterns have slopes different from slopes of the side surfaces of the plurality of first mask patterns.

3. The method of claim 1, wherein side surfaces of the plurality of first mask patterns and the plurality of second mask patterns comprise inverted slopes.

4. The method of claim 1, wherein the sacrificial layer comprises silicon oxide, and each of the plurality of first mask patterns and the plurality of second mask patterns comprises polysilicon, a metal, a metal nitride or a combination thereof.

5. The method of claim 4, wherein the plurality of second mask patterns comprise materials different from the plurality of first mask patterns.

6. The method of claim 1, wherein forming the plurality of first mask patterns and the plurality of second mask patterns comprises:
   forming a plurality of first trenches in parallel by patterning the sacrificial layer;
   forming the plurality of first mask patterns in the plurality of first trenches;
   forming a plurality of second trenches in parallel by patterning the sacrificial layer and the plurality of first mask patterns; and
   forming the plurality of second mask patterns in the plurality of second trenches,
   wherein the plurality of second trenches completely pass through the plurality of first mask patterns.

7. The method of claim 1, wherein forming the plurality of first mask patterns and the plurality of second mask patterns comprises:
   forming a plurality of first trenches in parallel by patterning the sacrificial layer;
   forming the plurality of first mask patterns in the plurality of first trenches;
   forming a plurality of second trenches in parallel by patterning the sacrificial layer; and
   forming the plurality of second mask patterns in the plurality of second trenches,
   wherein the plurality of second trenches are formed between the plurality of first mask patterns.

8. The method of claim 1, wherein forming the plurality of first mask patterns and the plurality of second mask patterns comprises;
   forming a plurality of first trenches in parallel by patterning the sacrificial layer;
   forming the plurality of first mask patterns in the plurality of first trenches;
   forming a plurality of second trenches in parallel by patterning the sacrificial layer and the plurality of first mask patterns; and
   forming the plurality of second mask patterns in the plurality of second trenches,
   wherein the plurality of first mask patterns remain at bottoms of the plurality of second trenches.

9. The method of claim 1, wherein a height of each of the plurality of first mask patterns and the plurality of second mask patterns is greater than a width thereof.

10. The method of claim 1, wherein each of the plurality of openings has an aspect ratio of 10:1 or greater.

11. A method of forming a semiconductor device comprising:
   forming a molding layer on a substrate;
   forming a sacrificial layer on the molding layer;
   forming a plurality of first mask patterns in parallel in the sacrificial layer;
   forming a plurality of second mask patterns, which cross the plurality of first mask patterns and are in parallel, in the sacrificial layer, wherein the plurality of first mask patterns and the plurality of second mask patterns comprise materials more opaque than the sacrificial layer, and upper surfaces of the sacrificial layer, the plurality of first mask patterns and the plurality of second mask patterns are disposed at an equal horizontal level;
   removing the sacrificial layer;
   forming a plurality of openings, which pass through the molding layer, using the plurality of first mask patterns and the plurality of second mask patterns as etch masks;
   forming a plurality of first electrodes in the plurality of openings;
   removing the molding layer;
   forming a capacitor dielectric layer on the plurality of first electrodes; and
   forming a second electrode on the capacitor dielectric layer.

12. The method of claim 11, wherein forming the molding layer comprises;
   forming a first molding layer on the substrate; and
   forming a second molding layer, which is thinner than the first molding layer, on the first molding layer.

13. The method of claim 12, wherein the second molding layer comprises a material having an etch rate lower than an etch rate of the first molding layer.

14. The method of claim 12, further comprising forming a support layer between the plurality of first electrodes,
   wherein the support layer contacts side surfaces of the plurality of first electrodes.

15. The method of claim 14, wherein forming the support layer comprises:
   forming a first support layer between the first molding layer and the second molding layer; and
   forming a second support layer on the second molding layer,
   wherein the first support layer and the second support layer comprise materials each having an etch selectivity with respect to the first molding layer and the second molding layer.

16. A method of forming a semiconductor device comprising:
   forming a molding layer on a substrate;
   forming a sacrificial layer on the molding layer;
   forming a plurality of first mask patterns in parallel in the sacrificial layer;
   forming a plurality of second mask patterns, which cross the plurality of first mask patterns and are in parallel, in the sacrificial layer, wherein the plurality of first mask patterns and the plurality of second mask patterns comprise materials more opaque than the sacrificial layer, and upper surfaces of the sacrificial layer, the plurality of first mask patterns and the plurality of second mask patterns are disposed at an equal horizontal level;
   removing the sacrificial layer;
   forming a plurality of openings, which pass through the molding layer, using the plurality of first mask patterns and the plurality of second mask patterns as etch masks;
   forming a plurality of first electrodes in the plurality of openings;
   forming a capacitor dielectric layer on the plurality of first electrodes; and
   forming a second electrode on the capacitor dielectric layer.

17. The method of claim 16, wherein upper ends of the plurality of first electrodes are disposed at levels lower than an upper end of the molding layer.

18. The method of claim 17, wherein the plurality of first electrodes contact sidewalls and bottoms of the plurality of openings.

19. The method of claim 17, wherein the capacitor dielectric layer contacts sidewalls of the plurality of openings and an upper surface of the molding layer.

20. The method of claim 16, wherein the second electrode fills the plurality of openings and covers the molding layer.

* * * * *